(12) United States Patent
Kanaoka et al.

(10) Patent No.: US 7,102,223 B1
(45) Date of Patent: Sep. 5, 2006

(54) SEMICONDUCTOR DEVICE AND A METHOD OF MANUFACTURING THE SAME

(75) Inventors: Taku Kanaoka, Hitachinaka (JP); Masashi Sahara, Hitachinaka (JP); Yoshio Fukayama, Ichinomiya (JP); Yutaro Ebata, Mito (JP); Kazuhisa Higuchi, Tachikawa (JP); Koji Fujishima, Kofu (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 31 days.

(21) Appl. No.: 10/633,583

(22) Filed: Aug. 5, 2003

(30) Foreign Application Priority Data

Aug. 29, 2002  (JP) .............................. 2002-250537

(51) Int. Cl.
*H01L 23/12* (2006.01)
*H01L 23/053* (2006.01)
(52) U.S. Cl. ....................... 257/700; 257/698; 257/781
(58) Field of Classification Search ................ 257/734, 257/698, 700, 781
See application file for complete search history.

(56) References Cited

U.S. PATENT DOCUMENTS 6,261,883 B1 * 7/2001 Koubuchi et al. .......... 438/197
6,291,331 B1 * 9/2001 Wang et al. ................. 438/618
6,297,563 B1 * 10/2001 Yamaha ....................... 257/781
6,440,783 B1 * 8/2002 Wong .......................... 438/155
6,828,681 B1 * 12/2004 Furuhata ...................... 257/758
2002/0019082 A1 * 2/2002 Wong .......................... 438/149
2002/0121701 A1 * 9/2002 Furuhata ...................... 257/758

FOREIGN PATENT DOCUMENTS

JP          3022565          1/2000

* cited by examiner

*Primary Examiner*—Minhloan Tran
*Assistant Examiner*—Victor A. Mandala
(74) *Attorney, Agent, or Firm*—Miles & Stockbridge PC

(57) ABSTRACT

A semiconductor device includes plural electrode pads arranged in an active region of a semiconductor chip, and wiring layers provided below the plural electrode pads wherein occupation rates of wirings arranged within the regions of the electrode pads are, respectively, made uniform for every wiring layer. To this end, in a region where an occupation rate of wiring is smaller than those in other regions, a dummy wiring is provided. On the contrary, when the occupation rate of wiring is larger than in other regions, slits are formed in the wiring to control the wiring occupation rate. In the respective wirings layers, the shapes, sizes and intervals of wirings below the respective electrode pads are made similar or equal to one another.

34 Claims, 31 Drawing Sheets

FIG. 46

| PAD PD | AREA OCCUPATION RATE OF WIRING BENEATH BUMP | |
|---|---|---|
| | M1 | M1 |
| OUTSIDE OF GATE ZIGZAG | 84.35% | 94.00% |
| INSIDE OF GATE ZIGZAG | 83.06% | 92.18% |
| OUTSIDE OF SOURCE ZIGZAG | 83.59% | 93.91% |
| INSIDE OF SOURCE ZIGZAG | 83.90% | 94.48% |
| CORNER DUMMY | 83.65% | 94.77% |
| DIGITAL INPUT | 83.66% | 93.65% |
| DIGITAL INPUT (OSC2) | 83.09% | 94.05% |
| DUMMY AT INPUT SIDE | 83.87% | 94.81% |
| ANALOG INPUT 1 | 83.45% | 94.81% |
| ANALOG INPUT 2 | 83.45% | 94.81% |
| ANALOG INPUT 3 | 83.53% | 94.81% |
| ANALOG INPUT 4 | 83.67% | 94.81% |
| ANALOG INPUT 5 | 83.10% | 94.81% |
| ANALOG INPUT 6 | 83.74% | 94.62% |
| ANALOG INPUT 7 | 83.50% | 94.81% |
| ANALOG INPUT 8 | 83.59% | 94.81% |
| ANALOG INPUT 9 | 83.81% | 94.81% |

| | | |
|---|---|---|
| MINIMUM | 83.06% | 92.18% |
| MAXIMUM | 84.35% | 94.81% |
| DIFFERENCE BETWEEN MAXIMUM AND MINIMUM | 1.29% | 2.64% |

| | | |
|---|---|---|
| AVERAGE | 83.59% | 94.41% |

SEMICONDUCTOR DEVICE AND A METHOD OF MANUFACTURING THE SAME

BACKGROUND OF THE INVENTION

This invention relates to a semiconductor device and also to a manufacturing technique thereof. More particularly, the invention relates to a semiconductor device having bump electrodes and also to a technique effective for application to the manufacturing technique thereof.

With multi-pin semiconductor devices such, for example, as LCD (liquid crystal display) drivers, a problem is involved in that the chip size increases with an increasing number of electrode pads. This is for the reason that the electrode pad for leading out an electrode of an integrated circuit within a semiconductor chip cannot be made small in size in comparison with the size reduction of element and wiring in view of the securing practice for bonding strength, bonding accuracy and standards on the part of packaging semiconductor chips, so that the chip size is determined depending on the number and size of electrode pads. To avoid this, with the case of multi-pin semiconductor devices, a technique or system is now being adopted wherein electrode pads are arranged in a more inner region of a semiconductor chip where elements and wirings are arranged (i.e. an active region).

It will be noted that semiconductor devices having bump electrodes are disclosed, for example, in Japanese Patent No. 3022565. In this patent, a technique is disclosed wherein a dummy pattern is arranged below electrode pads.

SUMMARY OF THE INVENTION

We have first found that the above-mentioned structure of the type wherein electrode pads are arranged in the active region has the following new problem.

More particularly, because elements and wirings are formed below electrode pads and thus, structures provided below electrode pads differ from one another, the heights of electrode pads within the main surface of a semiconductor chip, i.e. the heights of bump electrodes bonded to the respective electrode pads, become non-uniform even if electrode pads are adjacent to each other or the bump thicknesses are made uniform. This eventually presents a problem that connection failure occurs between the electrode pads of a semiconductor chip and corresponding wirings of a packaging body for the semiconductor chip.

An object of the invention is to provide a technique wherein the heights of a plurality of electrode pads within a main surface of a semiconductor chip can be made uniform.

The above and other objects and novel features of the invention will become apparent from the following description with reference to the accompanying drawings.

A typical embodiment of the invention among those embodiments set forth in this application is briefly described below.

According to the invention, a semiconductor device is provided wherein underlying structures provided below a plurality of electrode pads arranged in a region of a main surface of a semiconductor chip where elements and wirings are arranged are made uniform.

BRIEF DESCRIPTION OF THE DRAWINGS

FIG. 46 is an illustrative view showing wiring occupation rates of the respective wiring layers provided beneath individual electrode pads of the semiconductor device shown in FIG. 25;

DETAILED DESCRIPTION OF THE PREFERRED EMBODIMENTS

Figure 1:
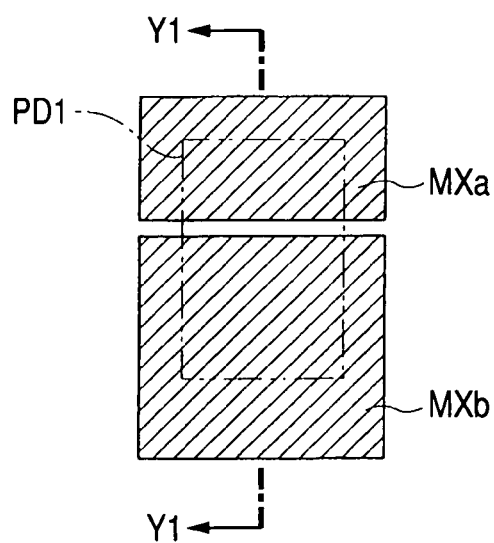
FIG. 1 is a plan view of an essential part of an instance of wiring provided as an underlying layer of an electrode pad of a semiconductor device according to one embodiment of the invention.

Although embodiments of the invention are illustrated by division into a plurality of sections or sub-embodiments if expediently necessary, these are not mutually irrelevant to one another unless otherwise stated. More particularly, one may be in relation with modifications, details, supplemental explanation and the like of part or all of others. In the following embodiments, where reference is made to the number and other parameters of elements (including the number, numerical value, quantity, range and the like), they should not be construed as limiting to specified values or numbers, respectively, except the case where otherwise specified or where limited to a specific value apparently in principle. That is, those values smaller than or larger than the respective specified values may also be within the scope of the invention. Moreover, it is as a matter of course that constituent elements (including steps) in the following embodiments are not always essential except the case where otherwise specified or where such elements are considered to be apparently essential in principle. Likewise, if reference is made to the shape, position, relation and the like of the constituent elements, then substantially like or similar shapes and the like are also within the scope of the invention except the case where otherwise specified or where such similar shapes should not be apparently included in principle. This is true of the above-indicated numbers and ranges. Throughout the drawings for illustrating the embodiments of the invention, like reference numerals indicate like parts or members having a similar function, which are not repeatedly explained after once having been illustrated. In the accompanying drawings for illustrating embodiments of the invention, such drawings including plan views may be hatched in some case for easily viewable purposes. The embodiments of the invention are now described with reference to the accompanying drawings.

Embodiment 1

This embodiment deals with a semiconductor device having an active-on-pad arrangement wherein a plurality of electrode pads (hereinafter referred to simply as pad or pads) are arranged in an active region having a semiconductor chip element or wirings disposed therein. In this semiconductor device, the structures of underlying layers for the plurality of pads are made uniform. More particularly, the occupation rates of the underlying wirings (wiring occupation rates) for the pads arranged within the respective pad regions are made uniform for every wiring layer. To this end, firstly, a dummy wiring is provided at a region, in which the wiring occupation rate is smaller than those wiring occupation rates of other pad regions, which is taken from a plurality of pad regions having the same wiring layer. In contrast, a slit or slits are formed in a wiring in a region (i.e. in a region where part of a wiring is removed), which has a wiring occupation rate larger than the wiring occupation rates of other pad regions and is taken from the plurality of pad regions having the same wiring layer. Secondly, an active region is arranged at an underlying layer of all the pads of a semiconductor chip, i.e. pads for integrated circuit and dummy pads.

Figure 2:
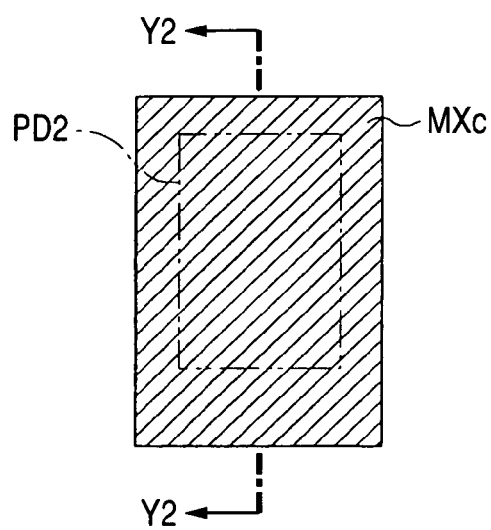
FIG. 2 is a plan view of an essential part of an instance of wiring, at the same layer as in FIG. 1, provided as an underlying layer of an electrode pad of the semiconductor device according to one embodiment of the invention.
Figure 3:
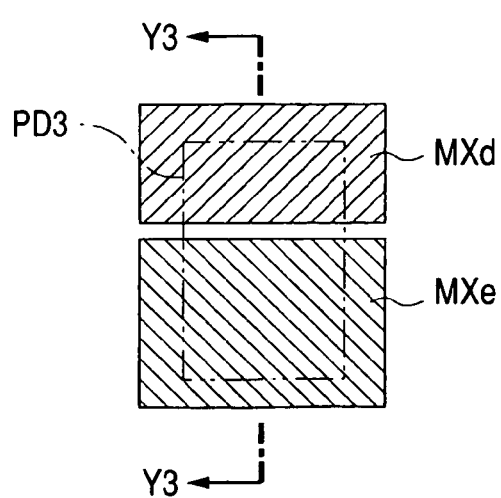
FIG. 3 is a plan view of an essential part of an instance of wiring, at the same layer as in FIGS. 1 and 2, provided as an underlying layer of an electrode pad of the semiconductor device according to one embodiment of the invention.
Figure 4:
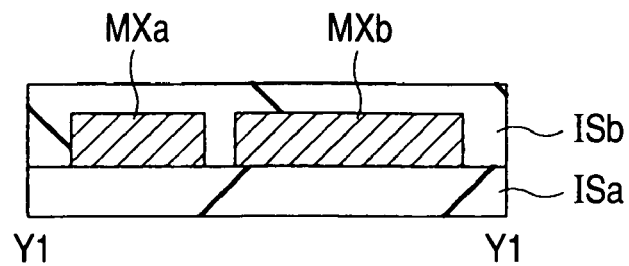
FIG. 4 is a sectional view, taken along line Y1—Y1 at the wiring of FIG. 1.
Figure 5:
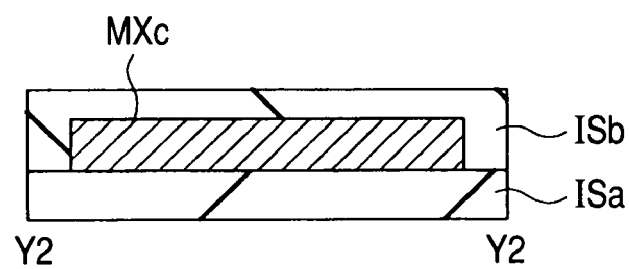
FIG. 5 is a sectional view of the wiring of FIG. 2, taken along line Y2—Y2 at the wiring of FIG. 2.
Figure 6:
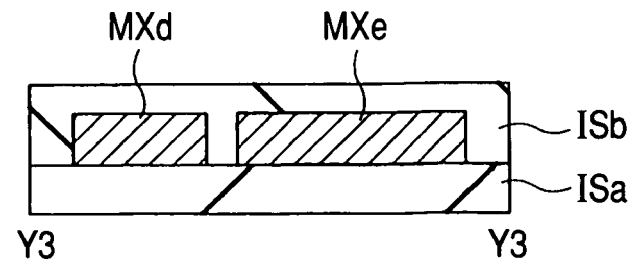
FIG. 6 is a sectional view, taken along line Y3—Y3 at the wiring of FIG. 3.

Initially, an arrangement of the dummy wiring is illustrated. FIGS. 1 to 3 are, respectively, a plan view showing an instance of an essential part of each of wirings MXa, MXb, MXc, MXd and MXe in a given wiring layer serving as an underlying layer of pads PD1 to PD3. FIGS. 4 to 6 are, respectively, sectional views, taken along lines Y1—Y1, Y2—Y2 and Y3—Y3 at the wirings MXa to MXe of FIGS. 1 to 3. The pads PD1 to PD3 are, respectively, a portion at which a bump is bonded and are disposed at different positions of the active region of the same semiconductor chip. The pads PD1 to PD3 are equal to one another with respect to the planar size and shape. The wirings MXa, MXb, MXc and MXd, respectively, indicate a wiring for signal or power supply which is necessary for constituting an integrated circuit of a semiconductor chip, whereas the wiring MXe indicates a dummy wiring not necessary for the arrangement of the integrated circuit of the semiconductor chip. All the wirings MXa to MXe are formed on an insulating film ISa by patterning, for example, a metal film made mainly of aluminium or the like or a built-up conductor film made mainly of aluminium or the like and other type of conductor film (e.g. a built-up conductor film obtained by depositing a metal film made mainly, for example, of titanium (Ti), titanium nitride (TiN), aluminium or the like and a film of titanium nitride in this order) according to photolithographic and etching techniques. Thee wirings are covered with an insulating film ISb. As is particularly shown in FIGS. 3 and 6, the dummy wiring MXe is arranged in a region which corresponds to the pad PD3 region and in which any wiring would not be otherwise arranged. In this way, the occupation rate of the underlying wiring within the pad PD3 region is so designed as to be equal to the occupation rates of the underlying wirings within the pads PD1 and PD2 shown in FIGS. 1 and 2. This permits the upper levels of the insulating film ISb within the regions of the pads PD1 to PD3 of FIGS. 1 to 3 to be uniform as is particularly shown in FIGS. 4 to 6. Moreover, the upper portions of the underlying insulating films ISb within the regions of the pads PD1 to PD3 can be improved with respect to the flatness thereof.

Figure 7:
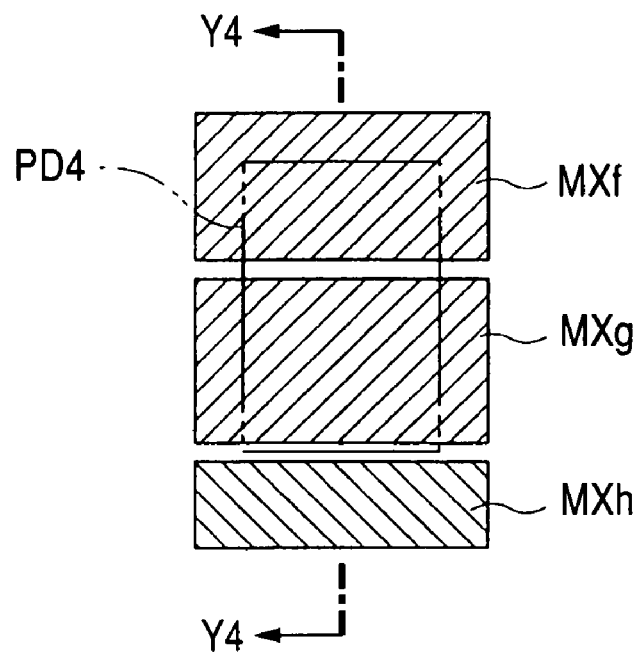
FIG. 7 is a plan view of an essential part of an instance of wiring, at the same layer as in FIGS. 1 to 3, provided as an underlying layer of an electrode pad of the semiconductor device according to another embodiment of the invention.
Figure 8:
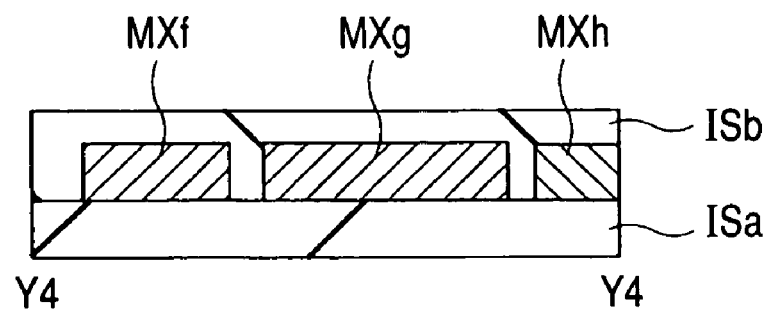
FIG. 8 is a sectional view, taken along line Y4—Y4 at the wiring of FIG. 7.

Although it is assumed that the dummy wiring MXe is provided as a wiring in a floating state which is not electrically connected with any other wiring, the dummy wiring may be formed by extending part of a wiring necessary for the arrangement of an integrated circuit (i.e. the wiring MXd in this case) to a region where the arrangement of a dummy wiring is required. In this case, although the wiring per se is not a dummy wiring, a wiring portion extending, for achieving the purpose of this embodiment, to a region not inherently required for arrangement of wiring is taken as a dummy. FIGS. 7 and 8, respectively, show a modification of arrangement of dummy wiring. FIG. 7 is a plan view showing an instance of an essential part of a wiring formed at the same layer level as the wirings shown in FIGS. 1 to 6, and FIG. 8 shows a sectional view taken along line Y4—Y4 at the wiring of FIG. 7. A pad PD4 indicates a pad which is located in an active region of the semiconductor chip different from the region where the pads PD1 to PD3 of FIGS. 1 to 3 are arranged, with its planar size and shape being same as those of the pads PD1 to PD3. Wirings MXf and MXg indicate wirings for signal or power supply which are necessary for the constitution of an integrated circuit of the semiconductor chip. Wiring MXh indicates a dummy wiring. In this connection, the occupation rates of the underlying wirings MXf and MXg within the region of the pad PDF are substantially same as those illustrated in FIGS. 1 to 3. From the standpoint that the occupation rates are made uniform, any dummy wiring is not required, and such a dummy wiring is not arranged within a region of the pad PD4. In this case, the dummy wiring MXh is arranged in the vicinity of an outer periphery of the pad PD4. If this dummy wiring MXh is not provided, the insulating film ISb in the vicinity of the outer periphery of the pad PD4 is recessed at the upper surface thereof, thereby causing steps to occur. Because the flat area of a bump bonded with the pad PD4 is slightly larger than that of the pad PD4, the step at the upper surface of the insulating film ISb in the vicinity of the outer periphery of the pad PD4 is reflected on the upper surface of the bump electrode. As a result, the bump is impeded with flatness at the top thereof and may become, in some case, lower in height than the tops of other bumps. To avoid this, the dummy wiring MXh is arranged in the vicinity of the outer periphery of the pad PD4, so that a step can be prevented from being formed at the upper surface of the insulating film ISb at the outer periphery of the pad PD4, thereby improving the flatness at the upper surface of the pad PD4 and thus ensuring the height of the pad PD4. In this way, the height at the top of the bump bonded with the pad PD4 can be mad equal to the height at the top of other bumps. It will be noted that the bumps are, respectively, formed in a uniform thickness. More particularly, a variation in thickness of bumps can be substantially neglected.

Figure 9:
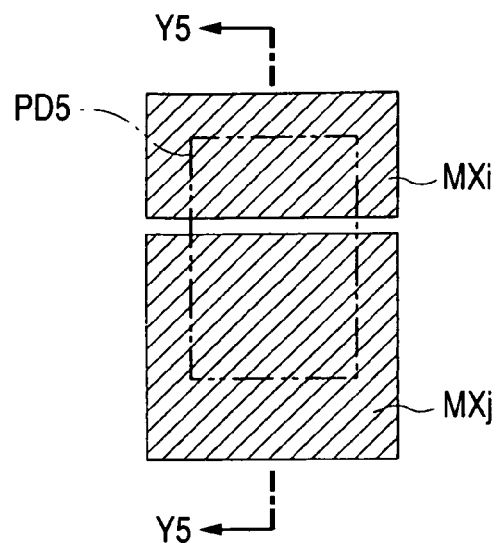
FIG. 9 is a plan view of an essential part of an instance of a wiring in an underlying layer of an electrode pad of a semiconductor device according to a further embodiment of the invention.
Figure 10:
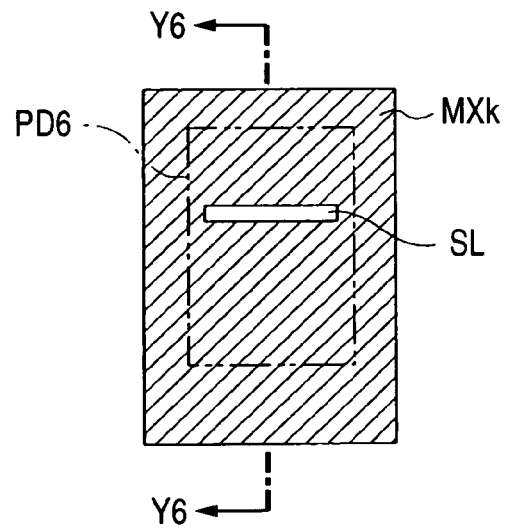
FIG. 10 is a plan view of an essential part of an instance of a wiring in an underlying layer, which is at the same layer level as in FIG. 9, of the electrode pad of the semiconductor device according to the further embodiment of the invention.
Figure 11:
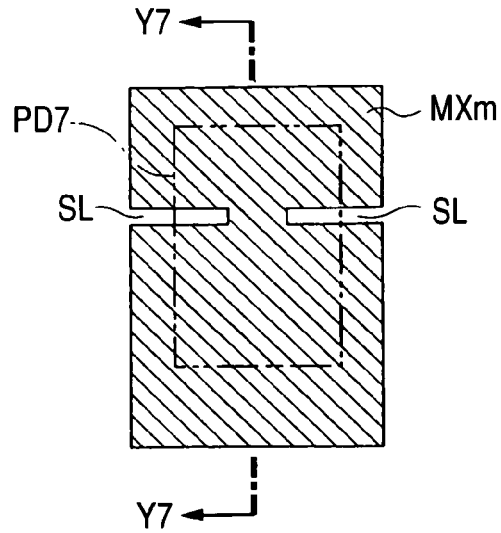
FIG. 11 is a plan view of an essential part of an instance of a wiring in an underlying layer, which is at the same layer level as in FIGS. 9 and 10, of the electrode pad of the semiconductor device according to the further embodiment of the invention.
Figure 12:
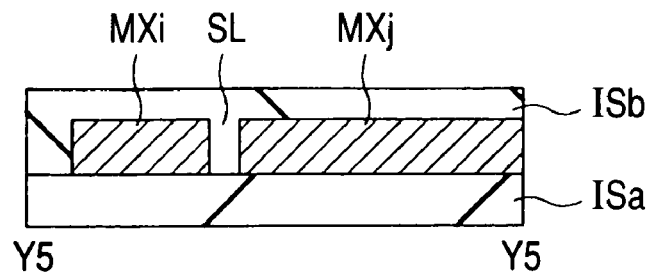
FIG. 12 is a sectional view, taken along line Y5—Y5 at the wiring of FIG. 9.
Figure 13:
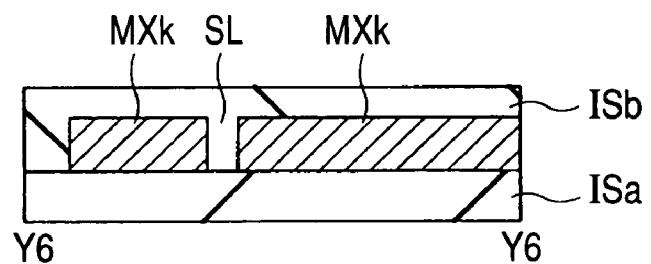
FIG. 13 is a sectional view, taken along line Y6—Y6 at the wiring of FIG. 10.
Figure 14:
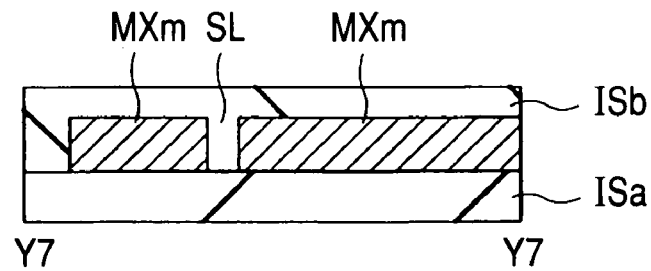
FIG. 14 is a sectional view, taken along line Y7—Y7 at the wiring of FIG. 11

Next, how to arrange the above slits is illustrated. FIGS. 9 to 11 are, respectively, a plan view showing instances of essential parts of wirings MXi, MXj, MXk and MXm in the same given wiring layer which is an underlying layer of the pads PD5 to PD7. FIGS. 12 to 14 are, respectively, sectional views, taken along lines Y5—Y5, Y6—Y6 and Y7-7 at the wirings MXi, MXj, MXk and MXm of FIGS. 9 to 11. The pads PD5 to PD7 are similar to the pads PD1 to PD3, and are not particularly illustrated. The wirings MXi, MXj, MXk and MXm, respectively, indicate those wirings for signal or power supply necessary for arrangement of an integrated circuit of a semiconductor chip. The materials and forming method of these wirings MXi, MXj, MXk and MXm are similar to those of the wirings MXa and the like. As is particularly shown in FIGS. 10, 11, 13 and 14, a slit SL is formed in part of the wirings MXk and MXm, respectively. The slit or slits SL are formed by removing part of the wiring MXk and MXm. This permits the occupation rates of the underlying wirings within the pads PD6, PD7 to become equal to the occupation rate of the underlying wiring within the pad PD5 of FIG. 9. In this manner, the heights of the upper surfaces of the underlying insulating film ISb within the regions of the pad PD5 to PD7 can be made uniform as shown in FIGS. 12 to 14. In addition, the flatness at the upper portion of the underlying insulating film ISb within the pad PD5 to PD7 can be improved. The slit SL may be formed at the center of the wiring MXk as shown in FIG. 10, or may be formed as extending from the outer periphery of the wiring MXm toward the center as shown in FIG. 11. In this embodiment, the slit SL of FIGS. 10 and 11 is formed at a position of the space between adjacent wirings MXi and MXj of FIG. 9. This allows the underlying states of the pads PD5 to PD7 to become more uniform, thereby ensuring a more uniform height and more improved flatness at the upper surface of the underlying insulating film ISb within the regions of the pads PD5 to PD7.

Figure 15:
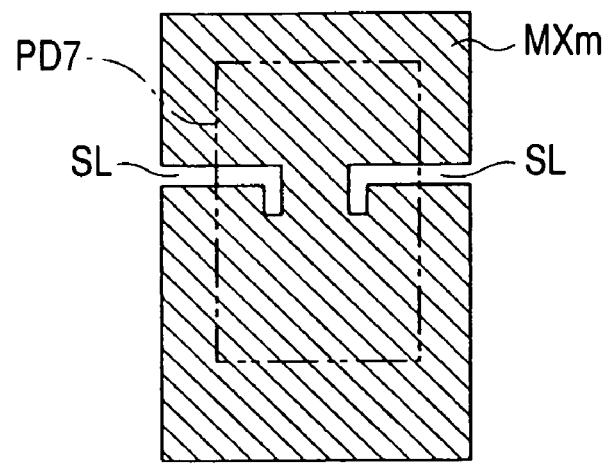
FIG. 15 is a plan view of an essential part of an instance of a wiring in an underlying layer of an electrode pad of a semiconductor device according to a still further embodiment of the invention.
Figure 16:
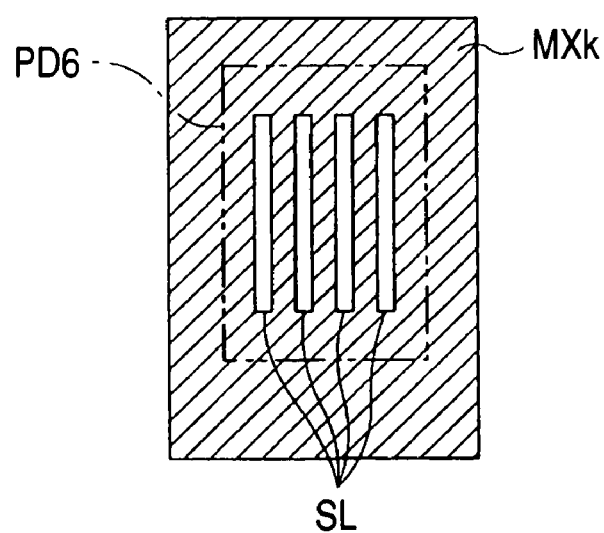
FIG. 16 is a plan view of an essential part of an instance of a wiring in an underlying layer of an electrode pad of a semiconductor device according to another embodiment of the invention.
Figure 17:
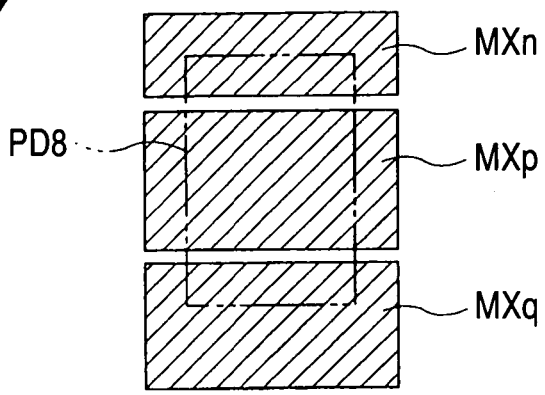
FIG. 17 is a plan view of an essential part of an instance of a wiring in an underlying layer of an electrode pad of a semiconductor device according to yet another embodiment of the invention.
Figure 18:
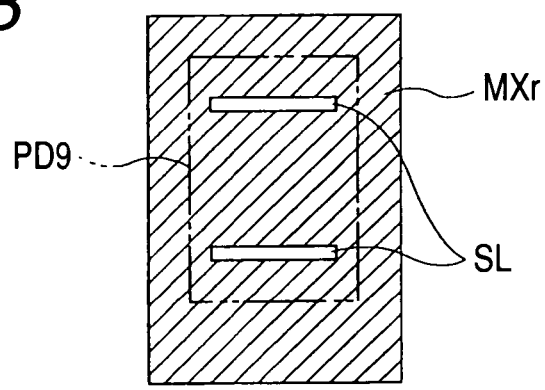
FIG. 18 is a plan view of an essential part of an instance of a wiring in an underlying layer, which is the same layer level as in FIG. 17, of the electrode pad of the semiconductor device according to the yet another embodiment of the invention.
Figure 19:
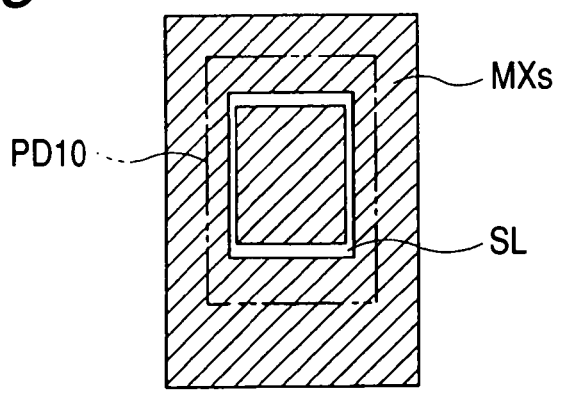
FIG. 19 is a plan view of an essential part of an instance of a wiring in an underlying layer, which is the same layer level as in FIGS. 17 and 18, of the electrode pad of the semiconductor device according to the yet another embodiment of the invention.

FIGS. 15 and 16, respectively, show modifications of slit SL. FIG. 15 shows an instance wherein each slit SL is bent downwardly at a central side end of the wiring as viewed in FIG. 15. FIG. 16 shows an instance wherein a plurality of slits SL are formed in parallel to one another as extending in vertical directions (in a lengthwise direction of the pad PD6) of FIG. 16. FIGS. 17 to 19 are, respectively, plan views showing instances of essential parts of underlying wirings MXn, MXp, MXq, MXr and MXs in the same given wiring layer of pads PD8 to PD10. The pads PD8 to PD10 are similar to the pads PD1 to PD3, with their illustration being omitted. The wirings MXn, MXp, MXq, MXr and MXs indicate those wirings for signal or power supply necessary for the arrangement of an integrated circuit of a semiconductor chip, and the material and forming method thereof are similar to those of the wiring MXa and the like. In this embodiment, as shown in FIGS. 18 and 19, slit SL is formed by adaptation to a position of space between adjacent wirings of the wirings MXn, MXp and MXq of FIG. 17. In FIG. 19, the slit SL is formed in the form of a frame. It will be noted that the pads PD1 to PD10 may be those pads for signal or power supply necessary for arrangement of an integrated circuit of a semiconductor chip, or may be dummy pads which are not required for the arrangement of the integrated circuit, respectively.

Figure 20:
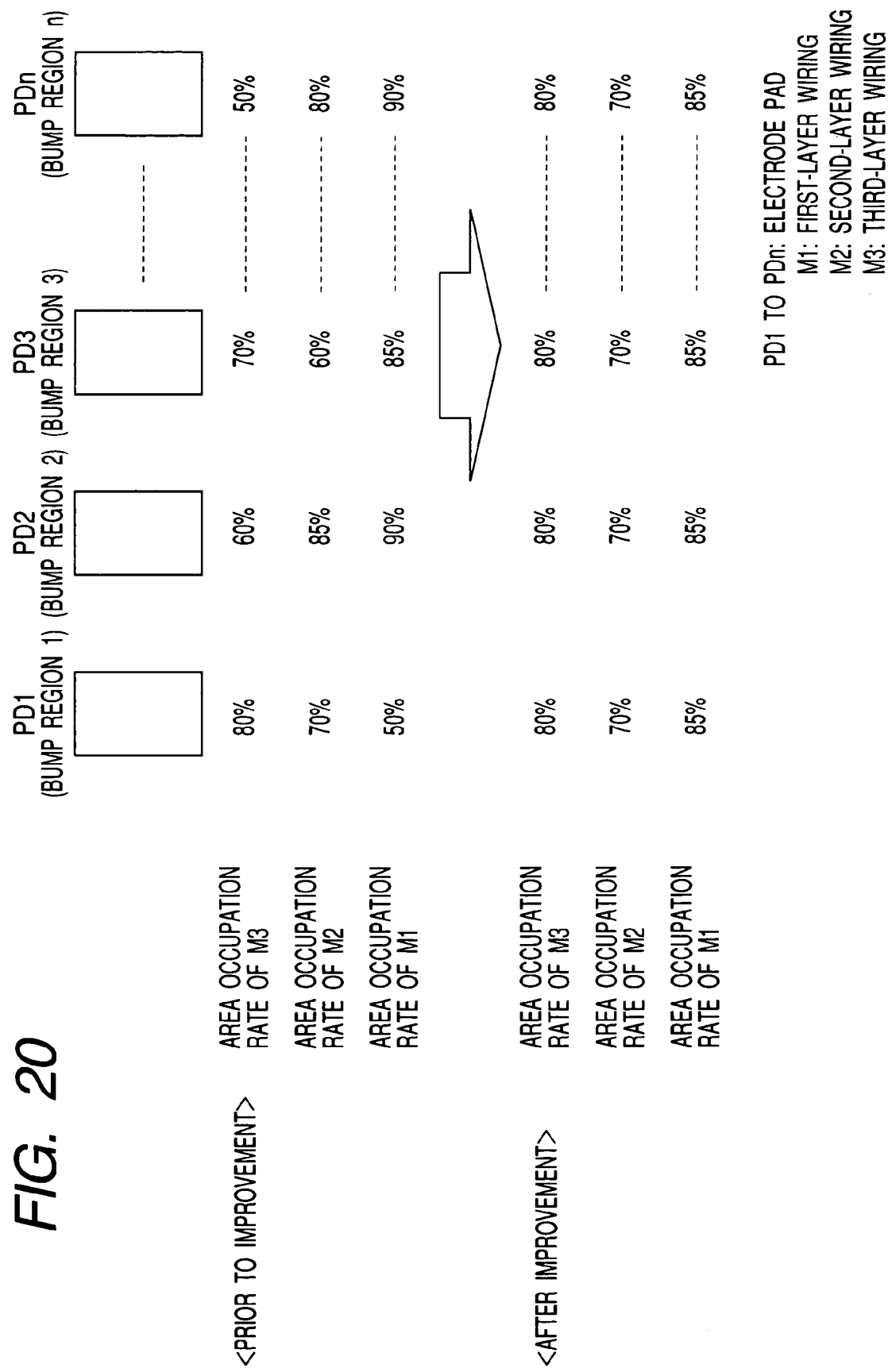
FIG. 20 is an illustrative view showing the comparison between the technique checked by us (not improved) and the technique made according to one embodiment of the invention (i.e. an improved technique) with respect to the occupation rate of the underlying wirings within a pad region.

According to this embodiment, the formation of a dummy wiring or slit permits the occupation rates of the underlying wirings of the pads disposed within all the regions of the pads in the main surface of the semiconductor chip to be made uniform for every wiring layer. FIG. 20 shows an instance of comparison between the technique tested by us (i.e. a non-improved technique) and the technique of this embodiment (i.e. an improved technique) with respect to the occupation rates of the underlying wirings within the regions of pads. With the non-improved technique, the respective wiring layers of first-layer wiring M1, second-layer wiring M2 and third-layer wiring M3 have variations in wiring area occupation rate within the respective regions of pads PD1 to PDn. Alternatively, there may be a portion where an active region exists or does not exists in the underlying layer of the respective pads PD1 to PDn. For these reasons, the underlying layers of the pads PD1 to PDn are caused to be stepped, so that the heights of the pads PD1 to PDn vary from one another. In the course of the manufacture of semiconductor devices, an underlying insulating film of wirings is etched back and flattened so as to conveniently carry out, for example, exposure or etching. From the standpoint of exposure or etching, good flatness is obtained at the upper surface of the underlying insulating film. From the standpoint of the heights of the pads PD1 to PDn, there may be some case where even though such an etching-back treatment as mentioned above is effected, the heights of the pad PD1 to PDn greatly vary due to the variation of the wiring occupation area rate within the regions of the pads PD1 to PDn and also due to the presence or absence of an active region. Since the pads PD1 to PDn are arranged in active regions, it is not possible to adopt a technique wherein a solid wiring is provided in the underlying layer of the respective pads PD1 to PDn in order to ensure the flatness at the upper surface of the underlying insulating film.

In contrast, according to this embodiment (after improvement), the respective wiring layers of the first-layer wiring M1, second-layer wiring M2 and third-layer wiring M3 are so designed as to have a uniform wiring area occupation rate within the regions of the pads PD1 to PDn. An active region is provided beneath all the pads PD1 to PDn. In this way, the underlying states of a plurality of pads within a main surface of the semiconductor chip (within a main surface of a wafer for the manufacturing process of a semiconductor device) can be made substantially uniform, under which the heights of the upper surface of the plural pads can be made substantially uniform. Thus, the heights at the tops of the bumps (bump electrodes) bonded with the respective pads can be made substantially uniform. Because the respective pads can be improved in flatness at the upper surfaces thereof, the flatness at the tops of the thus bonded bumps can also be improved. Accordingly, it becomes possible to well connect a plurality of pads of a semiconductor chip and a plurality of wirings of a packaging body for packaging the semiconductor chip via bumps without suffering any inconvenience. It is preferred that the underlying wirings of the respective pads are so formed as to be equal to one another with respect to the shape, size, pattern arranging position and arranging pitch. Thus, the underlying states of a plurality of pads can be further improved and the plurality of pads are made more uniform with respect to the heights and flatness at the upper surfaces of the plurality of pads. Eventually, the height and flatness at the tops of the bumps bonded with the respective pads can be made more uniform.

Thus, according to this embodiment, the underlying states of a plurality of pads are made uniform so as to make more uniform height and flatness at the tops of a plurality of pads. This effect is not lost if the uniformity is within a certain range of error with full uniformity being not ensured. Preferably, the occupation rate of wirings beneath the respective pads is within an error of about 10%, more preferably within an error of about 5%, within which the height and flatness at the upper surfaces of the pads can be made substantially uniform.

In this embodiment, the underlying layers beneath the respective pads are indicated as first-layer wiring M1, second-layer wiring M2 and third-layer wiring M3, and the wiring occupation rates of the respective wiring layers should preferably be at 50% or over. This is for the reason that where a number of insulating films are provided below the respective pads, the upper surface is recessed and steps are liable to develop. Nevertheless, if metal layers which are harder than an insulating film are formed largely in number, a variation of steps is reduced, with the likelihood that the height and flatness at the upper surface of the pads are made uniform.

Figure 21:
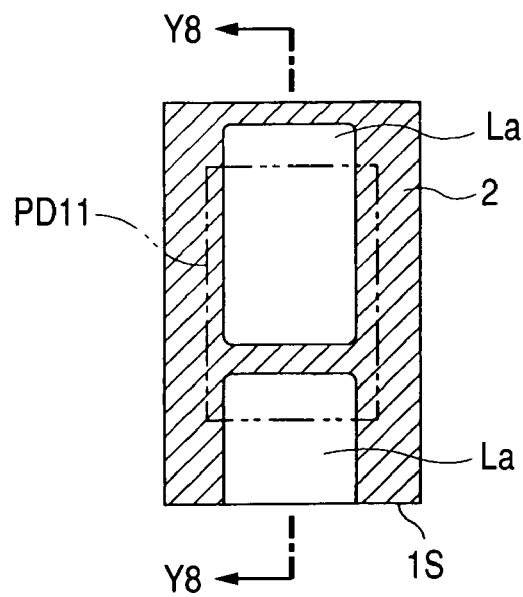
FIG. 21 is a plan view of an essential part of an instance of a semiconductor substrate in an underlying layer of an electrode pad of a semiconductor device according to another embodiment of the invention.
Figure 22:
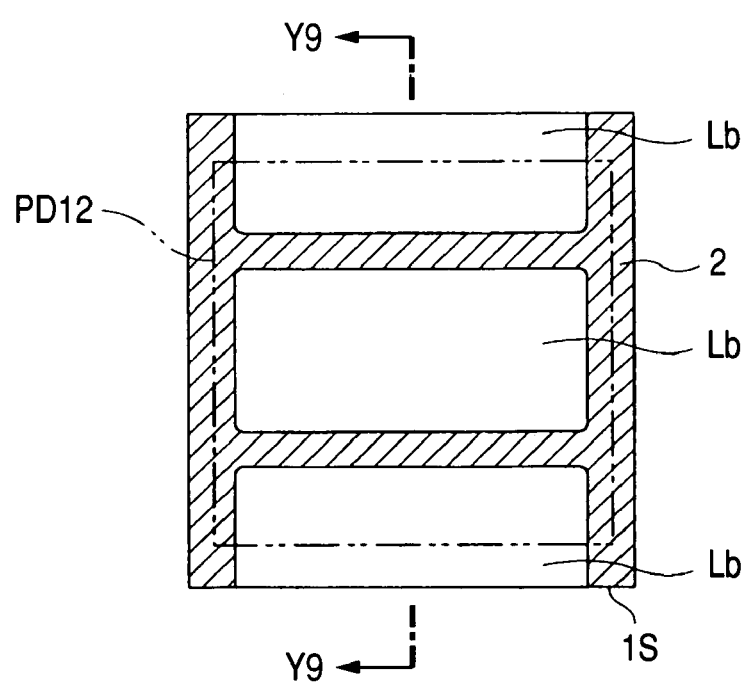
FIG. 22 is a plan view of an essential part of an instance of a semiconductor substrate in an underlying layer of an electrode pad, which is different from the electrode pad of FIG. 21, of the semiconductor device according to another embodiment of the invention.
Figure 23:
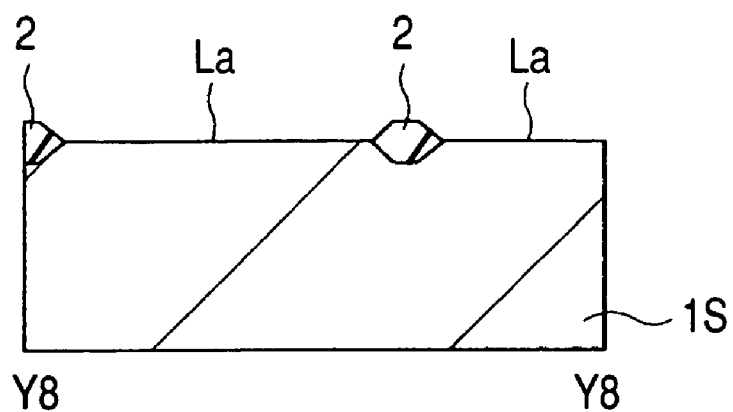
FIG. 23 is a sectional view, taken along line Y8—Y8 at the semiconductor substrate of FIG. 21.
Figure 24:
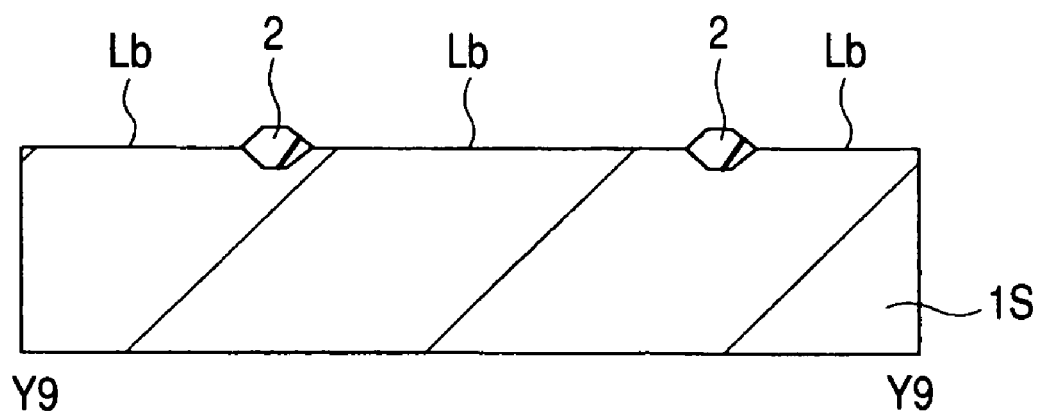
FIG. 24 is a sectional view, taken along line Y9—Y9 at the semiconductor substrate of FIG. 22.

Next, layout of the active regions is illustrated. FIGS. 21 and 22, respectively, show a plan view of an instance of an essential part of an underlying semiconductor substrate 1S (hereinafter referred to simply as substrate) of pads PD11 and PD 12. FIGS. 23 and 24 are, respectively, sectional views, taken along lines Y8—Y8 and Y9—Y9 of FIGS. 21 and 22. In FIGS. 21 and 22, the drawings are, respectively, hatched at an isolation portion 2 for easy review. This isolation portion 2 is, for example, LOCOS (local oxidation of silicon) formed by oxidation of a substrate 1S or STI (shallow trench isolation) or the like formed by forming a groove in the substrate 1S and burying an insulating film in the groove, and is thus formed for dielectric isolation of individual active regions. The pad PD11 is a pad for signal or power supply which is necessary for constituting an integrated circuit of a semiconductor chip. An active region La, in which a given type of element is formed, is arranged below the pad PD11. On the other hand, pad PD12 is a dummy pad which is not required for arrangement of an integrated circuit of a semiconductor chip. In these figures, there is shown an instance where the planar size of the dummy pad PD12 is larger than that of the pad PD11. An active region Lb is also arranged below the dummy pad PD12. This active region Lb is not provided so as to form a given type of element, but is used as an active region for dummy pad which is provided so that a plurality of pads of a semiconductor chip are made uniform at the upper surface level (i.e. the height of the tops of a plurality of bumps) as set forth hereinabove. The provision of the active regions as the underlying layers of all the pads including the dummy-pad PD 12 renders it easy to make uniform flatness and height at the upper surfaces of an underlying insulating film for all the pads. More particularly, the underlying state of a plurality of pads can be made more uniform and thus, the height and flatness of the upper surfaces of a plurality of pads can be made more uniform. This leads to further uniform height and flatness at the tops of the bumps bonded with the respective pads.

Figure 25:
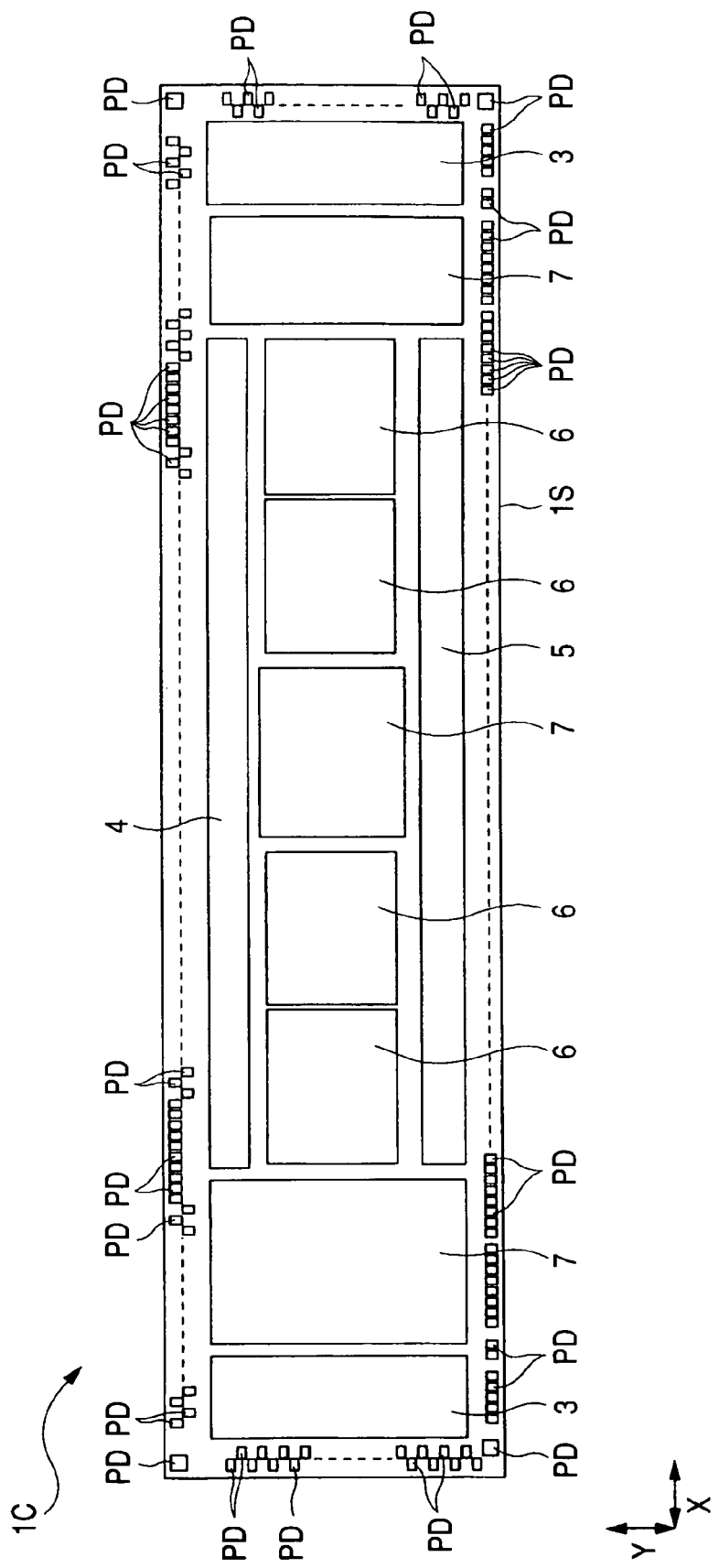
FIG. 25 is a plan view showing, as a whole, an instance of a semiconductor chip constituting a semiconductor device according to the invention.
Figure 26:
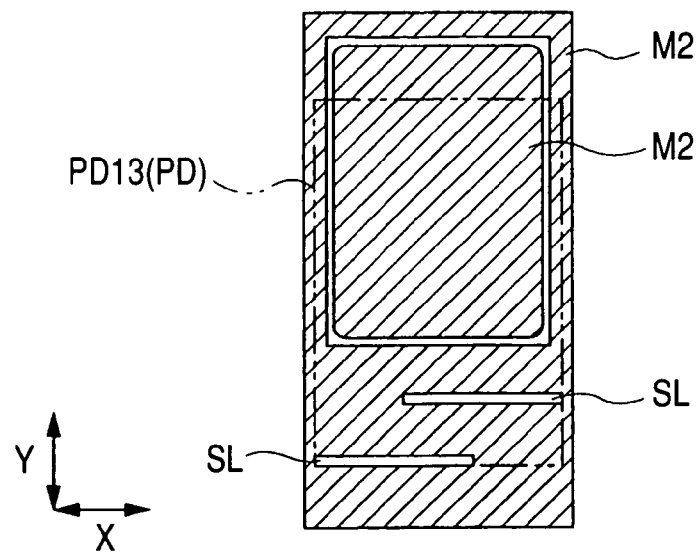
FIG. 26 is a plan view of an instance of a second-layer wiring beneath an electrode pad of the semiconductor device according to another embodiment of the invention.
Figure 27:
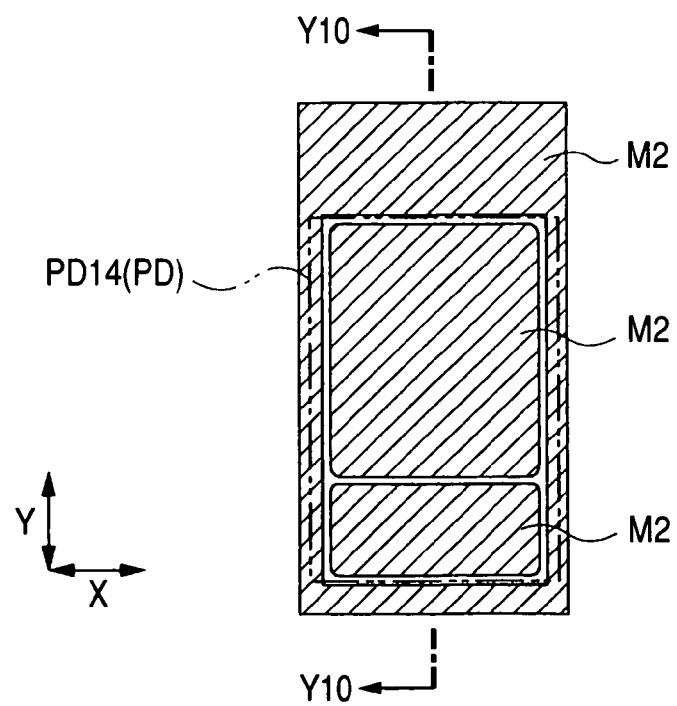
FIG. 27 is a plan view of an instance of a second-layer wiring beneath an electrode pad, different from that of FIG. 26, of the semiconductor device embodying the invention.
Figure 28:
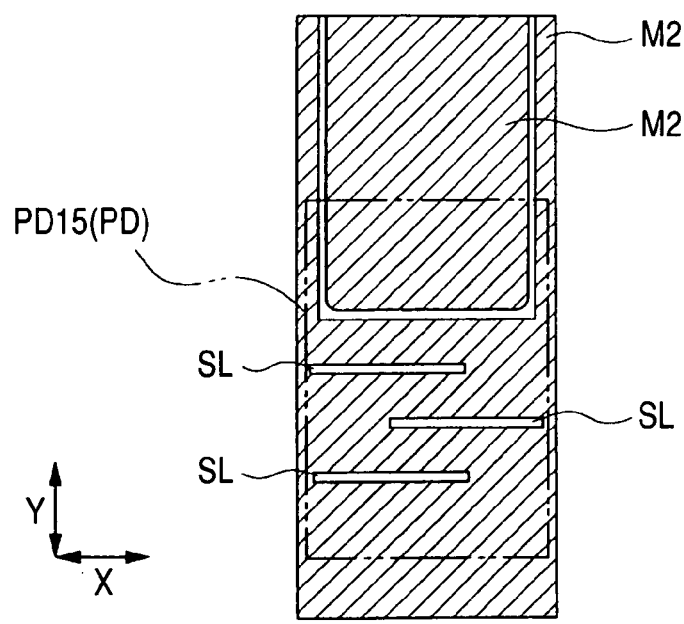
FIG. 28 is a plan view of an instance of a second-layer wiring beneath an electrode pad, different from those of FIGS. 26 and 27, of the semiconductor device embodying the invention.
Figure 29:
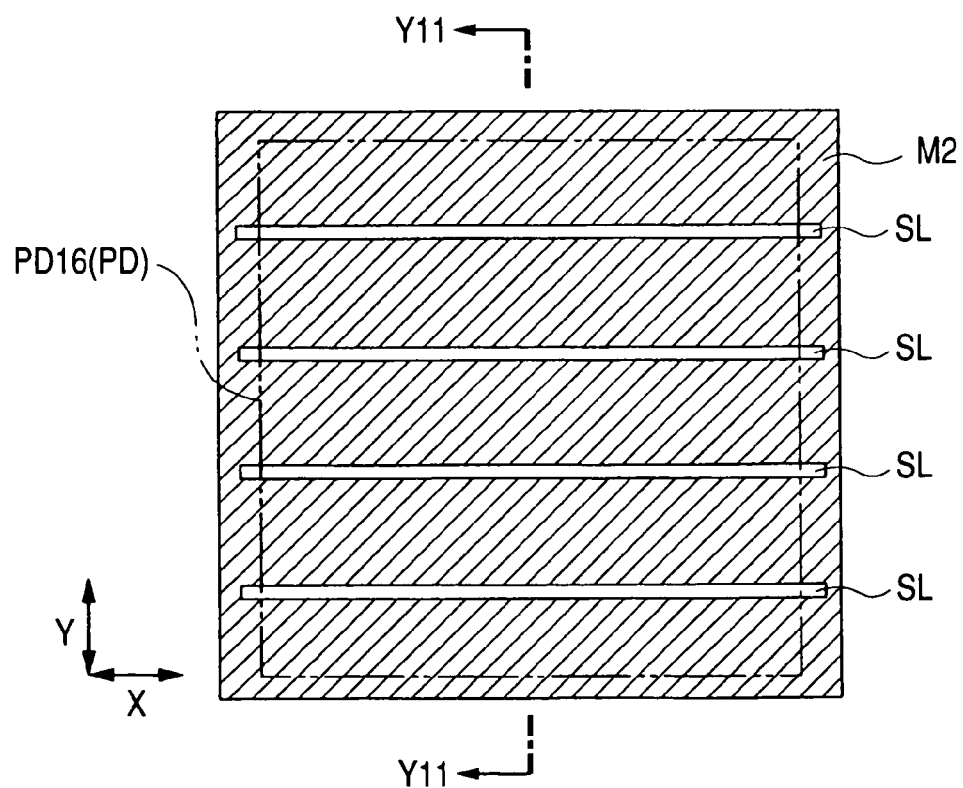
FIG. 29 is a plan view of an instance of a second-layer wiring beneath an electrode pad, different from those of FIGS. 26 to 28, of the semiconductor device embodying the invention.
Figure 30:
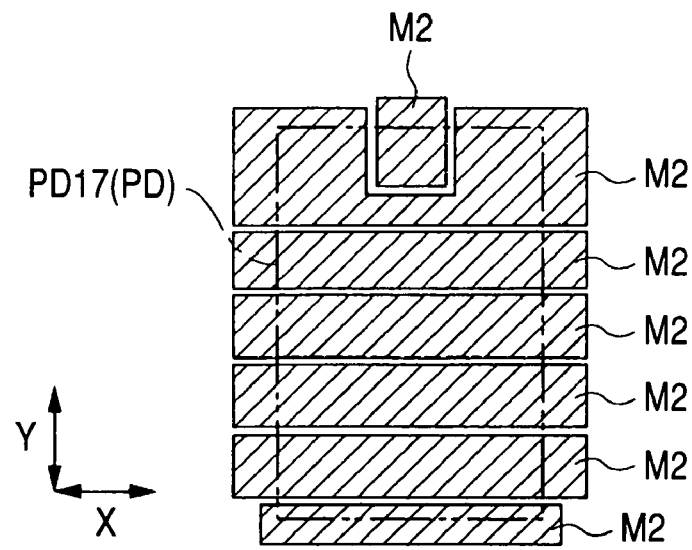
FIG. 30 is a plan view of an instance of a second-layer wiring beneath an electrode pad, different from those of FIGS. 26 to 29, of the semiconductor device embodying the invention.
Figure 31:
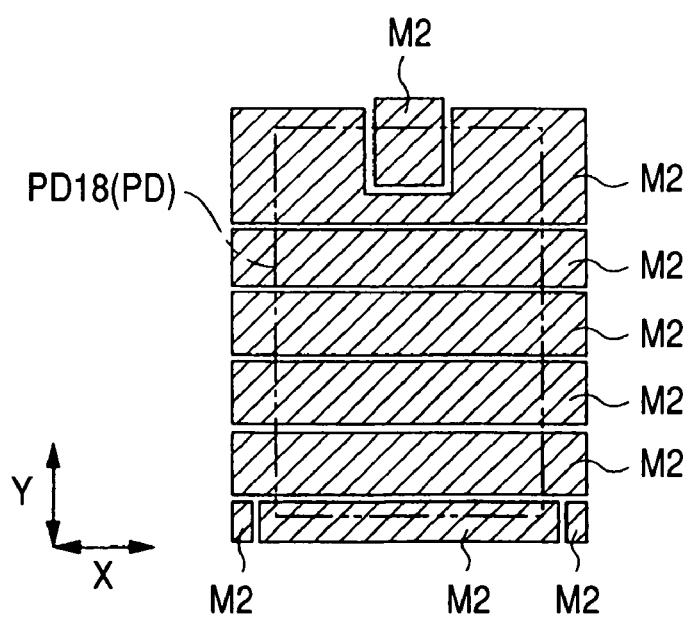
FIG. 31 is a plan view of an instance of a second-layer wiring beneath an electrode pad, different from those of FIGS. 26 to 30, of the semiconductor device embodying the invention.
Figure 32:
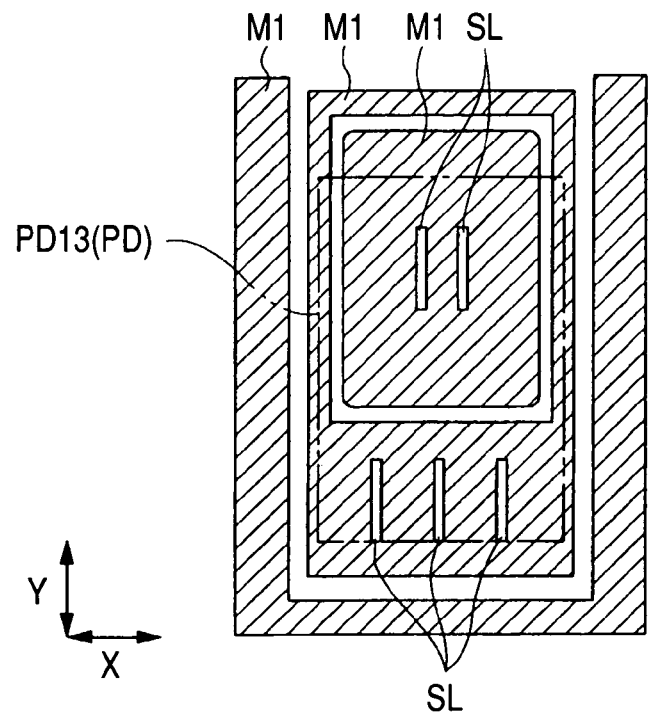
FIG. 32 is a plan view of an instance of a first-layer wiring beneath the electrode pad, which is the same as shown in FIG. 26, of the semiconductor device embodying the invention.
Figure 33:
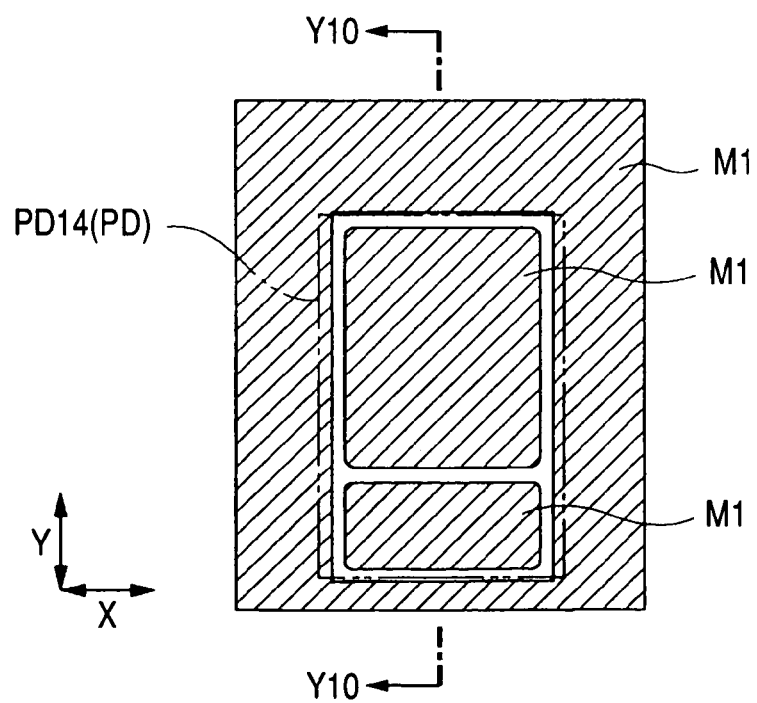
FIG. 33 is a plan view of an instance of a first-layer wiring beneath the electrode pad, which is the same as shown in FIG. 27, of the semiconductor device embodying the invention.
Figure 34:
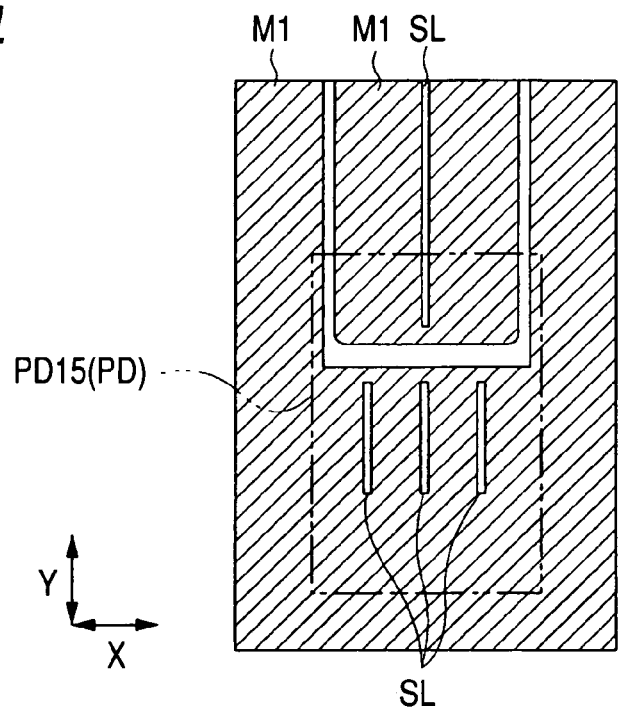
FIG. 34 is a plan view of an instance of a first-layer wiring beneath the electrode pad, which is the same as shown in FIG. 28, of the semiconductor device embodying the invention.
Figure 35:
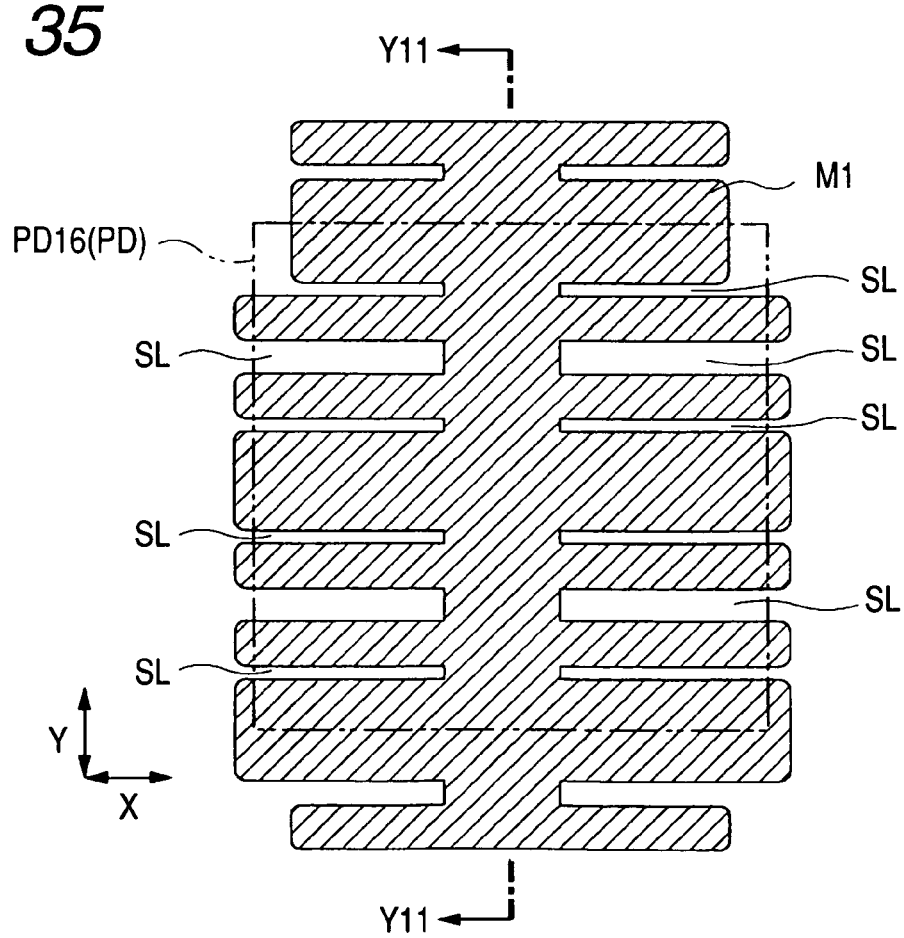
FIG. 35 is a plan view of an instance of a first-layer wiring beneath the electrode pad, which is the same as shown in FIG. 29, of the semiconductor device embodying the invention.
Figure 36:
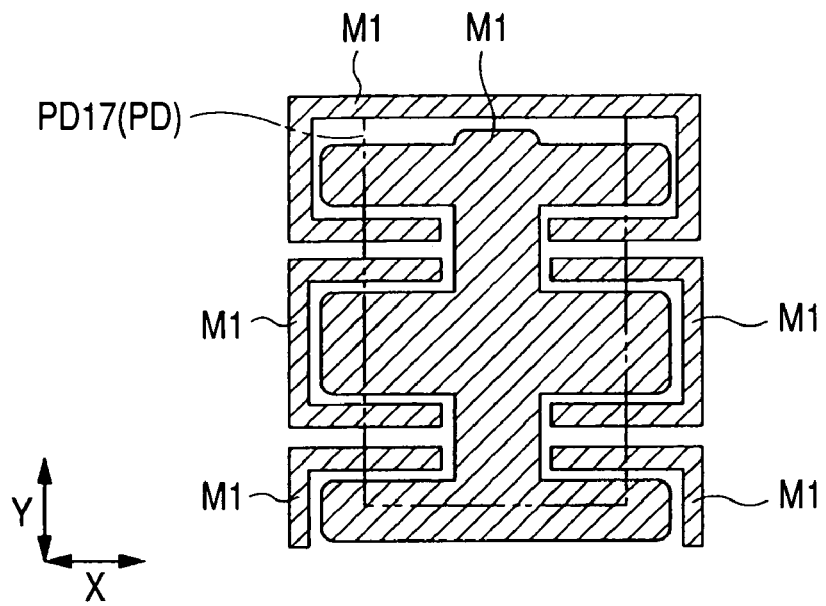
FIG. 36 is a plan view of an instance of a first-layer wiring beneath the electrode pad, which is the same as shown in FIG. 30, of the semiconductor device embodying the invention.
Figure 37:
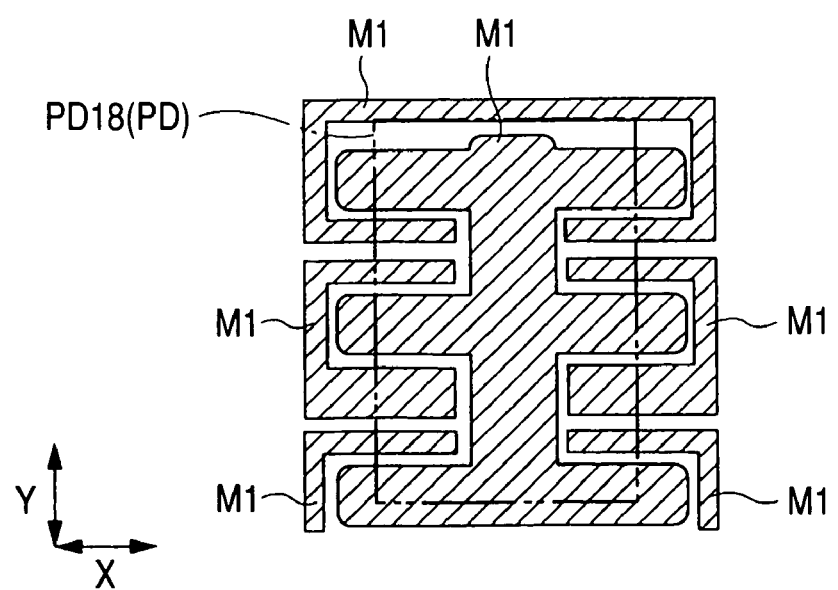
FIG. 37 is a plan view of an instance of a first-layer wiring beneath the electrode pad, which is the same as shown in FIG. 31, of the semiconductor device embodying the invention.
Figure 38:
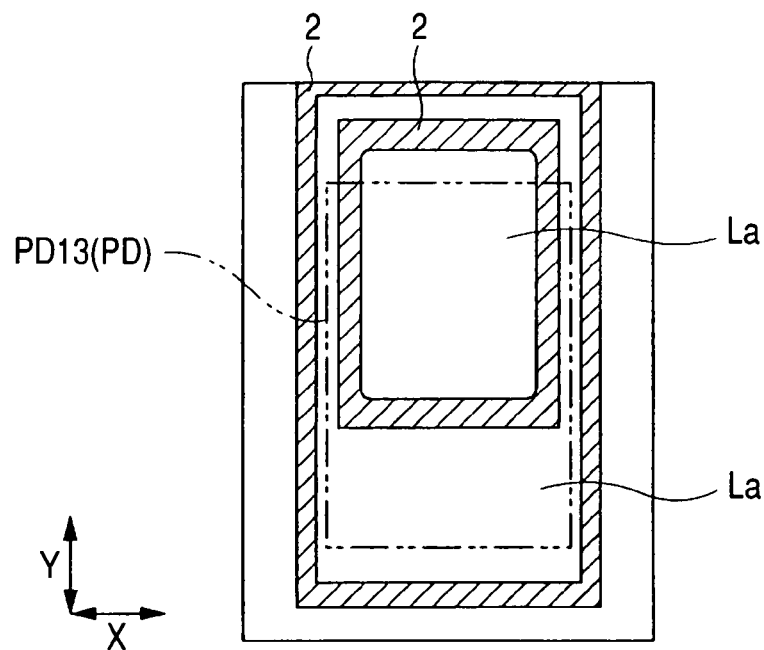
FIG. 38 is a plan view of an instance of a main surface of a semiconductor substrate in the underlying layer of the electrode pad, which is the same as shown in FIG. 26, of the semiconductor device embodying the invention.
Figure 39:
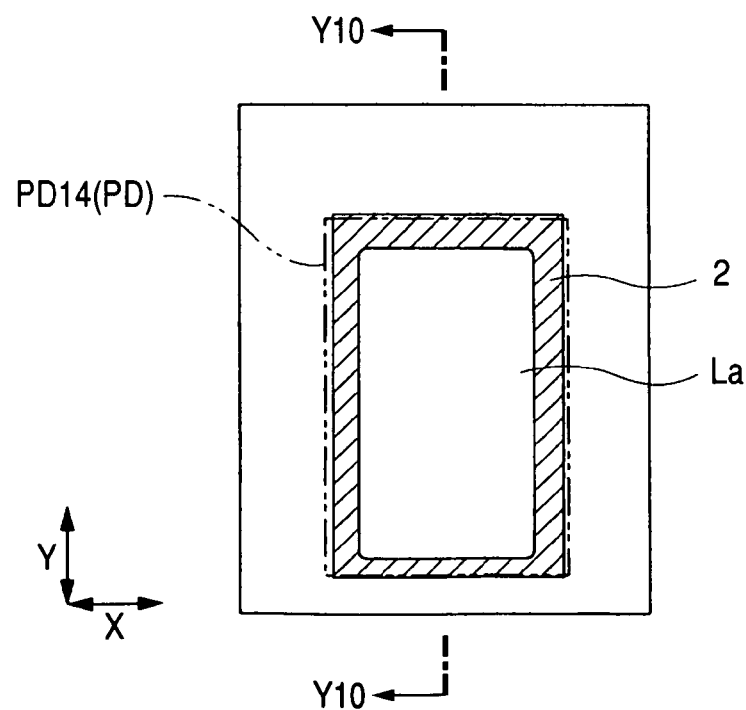
FIG. 39 is a plan view of an instance of a main surface of a semiconductor substrate in the underlying layer of the electrode pad, which is the same as shown in FIG. 27, of the semiconductor device embodying the invention.
Figure 40:
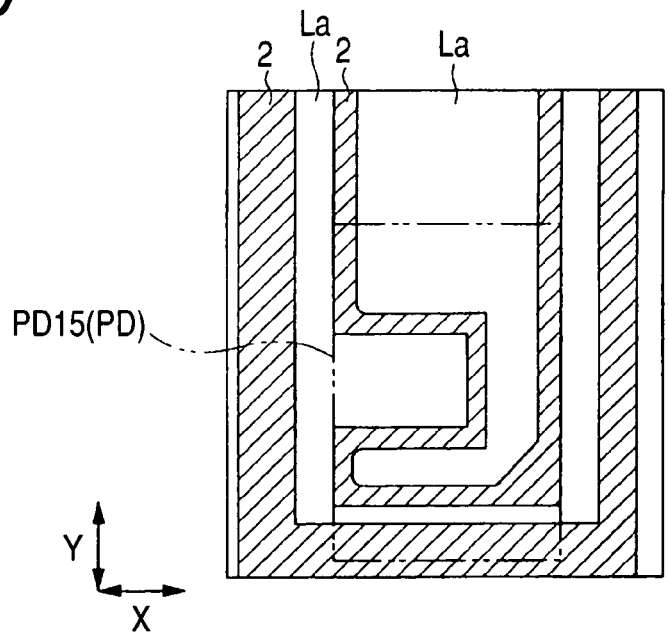
FIG. 40 is a plan view of an instance of a main surface of a semiconductor substrate in the underlying layer of the electrode pad, which is the same as shown in FIG. 28, of the semiconductor device embodying the invention.
Figure 41:
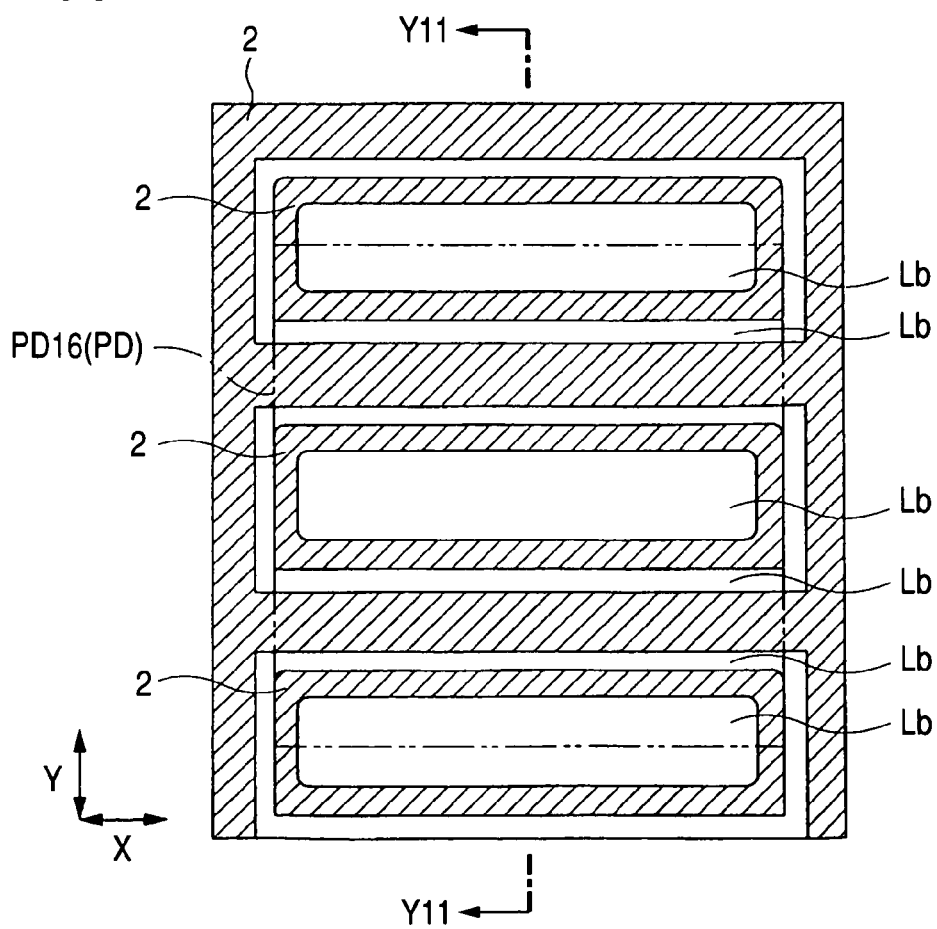
FIG. 41 is a plan view of an instance of a main surface of a semiconductor substrate in the underlying layer of the electrode pad, which is the same as shown in FIG. 29, of the semiconductor device embodying the invention.
Figure 42:
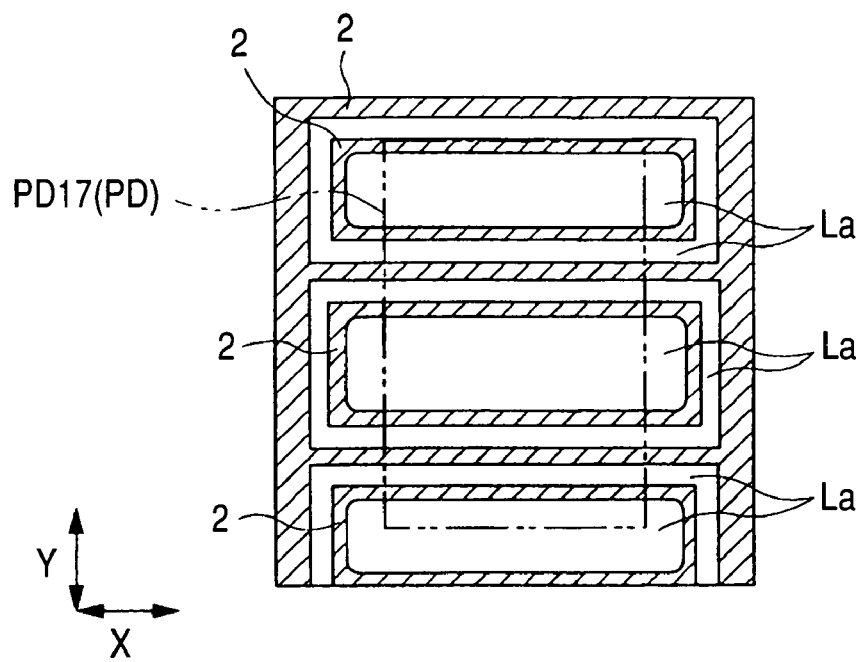
FIG. 42 is a plan view of an instance of a main surface of a semiconductor substrate in the underlying layer of the electrode pad, which is the same as shown in FIG. 30, of the semiconductor device embodying the invention.
Figure 43:
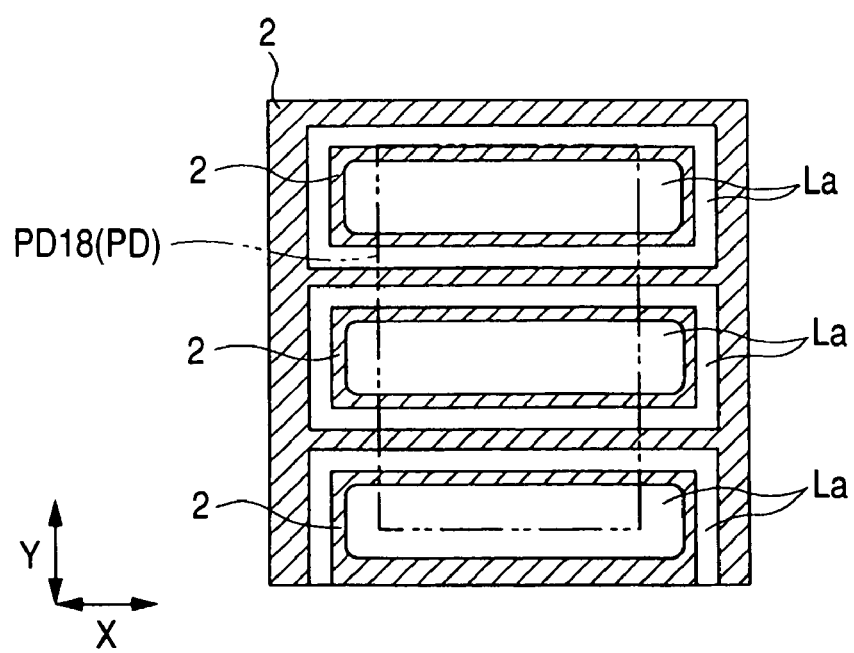
FIG. 43 is a plan view of an instance of a main surface of a semiconductor substrate in the underlying layer of the electrode pad, which is the same as shown in FIG. 31, of the semiconductor device embodying the invention.

Next, a specific application of the semiconductor device according to this embodiment is described. FIG. 25 is a plan view showing, as a whole, an instance of a semiconductor chip 1C for constituting the semiconductor device of this embodiment. This semiconductor chip 1C has, for example, a substrate 1S which is formed in an elongated, rectangular shape and also has, on a main surface thereof, a LCD drive circuit for driving a liquid crystal display (LCD). This LCD driver circuit has the function of supplying a voltage to individual pixels of a cell array of LCD to control the direction of liquid crystal molecules, and has a gate drive circuit 3, a source drive circuit 4, a liquid crystal drive circuit 5, a graphic RAM (random access memory) 6 and a peripheral circuit 7. In the vicinity of the outer periphery of the semiconductor chip 1C, there are arranged the plural pads PD at given intervals along the outer periphery of the semiconductor chips 1C. These plural pads PD are provided on the active region where elements and wirings of the semiconductor chips are arranged. These plural pads PD includes pads for integrated circuit necessary for constituting an integrated circuit and dummy pads not necessary for the constituting an integrated circuit. The pads PD are arranged in a zigzag form in the vicinity of one long side and two short of the semiconductor chip 1C. The plural pads arranged in the zigzag form are made mainly of those for gate output signal and source output signal. More particularly, the plural pads, which have been arranged in a zigzag form at the center of the long side of the semiconductor chip 1C are for source output signal, and the plural pads, which have been arranged in a zigzag form along both short sides of the semiconductor chip 1C are for gate output signal. Such a zigzag arrangement permits a large number of pads required for gate and source output signals to be arranged while suppressing the semiconductor chip 1C from increasing in size. More particularly, the chip size can be reduced, and the number of pads (pins) can be increased. A plurality of pads PD arranged in parallel to one another, not in a zigzag form, in the vicinity of the other long side of the semiconductor chip 1C are those pads for digital or analog input signal. In the vicinity of the four corners of the semiconductor chip 1C, pads PD having a relatively large planar size are arranged. This relatively large-sized PD pad indicates a corner dummy pad. The relative small pad PD has a planar size, for example, of about 35 μm×50 μm. The planar size of the relatively large-sized pad PD (corner dummy pad) is, for example, at about 80 μm×80 μm. The pitch of the adjacent pitch is, for example, at about 30 μm to 50 μm. The total number of the pads PD is, for example, at about 800.

Figure 44:
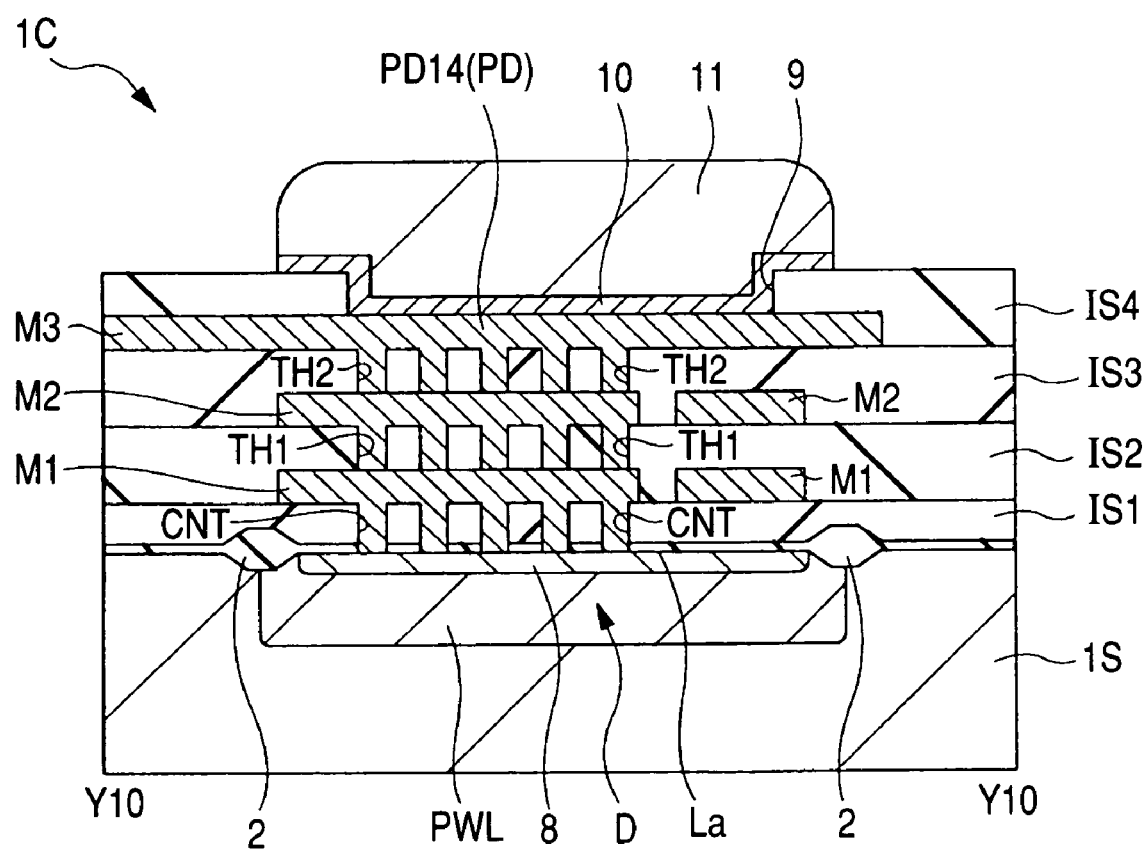
FIG. 44 is a sectional view, taken along lines Y10—Y10 of FIGS. 27, 33 and 39.

Next, the state of the underlying layer of the pads PD in the semiconductor device according to this embodiment is described with reference to FIGS. 26 to 45. In these figures, a semiconductor device having a three-layered wiring structure is exemplified. FIGS. 26 to 31 are, respectively, a plan view showing an instance of an essential part of wiring Mw in a second wiring layer beneath pads PD13 to PD 18 (PD), and FIGS. 32 to 37 are, respectively, a plan view showing an instance of an essential part of a wiring M1 in a first wiring layer serving as an underlying layer of the same pads PD13 to PD18 as in FIGS. 26 to 31. FIGS. 38 to 43 are, respectively, a plan view of an instance of an essential part of a main surface of a substrate serving as an underlying layer of the same pads PD13 to PD18 as in FIGS. 26 to 31. FIG. 44 is a sectional view, taken along line Y10—Y10 of FIGS. 27, 33 and 39, and FIG. 45 is a sectional view, taken along line Y11-Y-11 of FIGS. 29, 35 and 39. The pads PD12, PD14 are, for example, those pads PD for gate output signal. The pad PD13 indicates a pad provided at an outer side (i.e. at a side nearer to the outer periphery of the semiconductor chip 1C) among those pads arranged in the zigzag form. The pad PD14 indicates a pad provided at an inner side (i.e. at a side nearer to the center of the semiconductor chip 1C) among those zigzag pads. The pad PD15 is a pad PD, for example, for source output signal, and indicates an inner side pad among the zigzag pads. The pad PD16 indicates, for example, a corner dummy pad. The pads PD17, PD18, respectively, indicate a pad PD for analog input signal, for example. It will be noted that although the pads PD13 to PD18 which are part of all the pads are indicated only for illustration, the embodiment of the invention can be applied to all the pads in practice. For easy review of the drawings, the first-layer wiring M1, the second-layer wiring M2 and the isolation portion 2 are depicted as being hatched.

The second-layer wirings M2 provided beneath the pads PD13 to PD18 are illustrated with reference to FIGS. 26 to 31. The second-layer wirings M2 beneath the pads PD13 to PD18 are formed in the same way as or similar to the second-layer wiring M2 of FIGS. 26, 27 and also of FIGS. 30, 31 with respect, for example, to the shape, size and positional relationship of wiring pattern. Moreover, there is a region where although the second-layer wirings M2 provided beneath the pads PD differ from one another with respect to the shape, size and positional relationship of wiring pattern, a slit SL or a dummy wiring is formed so that the occupation rates (wiring occupation rates) of the second-layer wirings M2 within the region of a plurality of pads PD13 to PD18 are equal to one another. It will be noted that the second-layer wirings M2 within the pad PD region may include, aside from the second-layer wirings M2 necessary for constituting the integrated circuit of the semiconductor chip, second-layer wirings M2 for dummy (which may include not only the cases where all the wirings serve for dummy and are in a floating condition, but also the cases where part of the wirings for integrated circuit is used as a dummy) which are provided from the standpoint of not requiring the constitution of the integrated circuit, but ensuring equal occupation rates within the pad region.

Next, the first-layer wirings serving as an underlying layer of the pads PD13 to PD18 are illustrated with reference to FIGS. 32 to 37. The first-layer wirings M1 beneath the pads PD13 to PD18 are formed in the same way as or similar to the first-layer wiring M1 of FIGS. 32, 33 and also of FIGS. 36, 37 with respect, for example, to the shape, size and positional relationship of wiring pattern. Moreover, there is a region where although they differ from one another with respect to the shape, size and positional relationship of wiring pattern, a slit SL or a dummy wiring is formed so that the occupation rates (wiring occupation rates) of the first-layer wirings M1 within the region of a plurality of pads PD13 to PD18 are equal to one another. It will be noted that the first-layer wirings M1 within the pad PD region may include, aside from the first-layer wirings M1 necessary for constituting the integrated circuit of the semiconductor chip, first-layer wirings M2 for dummy (which may include not only the cases where all the wirings serve for dummy and are in a floating condition, but also the cases where part of the wirings for integrated circuit is used as a dummy) which are provided from the standpoint of not requiring the constitution of the integrated circuit, but ensuring equal occupation rates within the pad region In this way, according to this embodiment, the occupation rates of the wirings within the pad PD region are made uniform in every wiring layer (e.g. each of the first and second wiring layers herein) of all the wiring layers provided below the pads. Thus, the height at the upper surfaces of the plural pads PD within the main surface of the semiconductor chip 1C can be made substantially uniform. This reflects on a substantially uniform level with respect to the height at the tops of the bumps bonded to the respective pads PD. Since the flatness over the upper surfaces of the respective pads PD can be improved, the flatness at the tops of the bumps bonded thereto can also be improved. This ensures good connection between the plural pads of the semiconductor chip 1C and a plurality of wirings of a packaging body for packaging the semiconductor chip 1C via bumps without inviting any inconvenience.

Next, the state of the main surface of the substrate 1S serving as an underlying layer of the pads PD13 to PD18 is illustrated with reference to FIGS. 38 to 43. In the embodiment, active regions La, Lb are provided for the underlying layers of all the pads PD of the semiconductor chip 1C. The active region is one which is defined as the isolation portion 2 for forming an element region in the main surface of the substrate 1S. Although provision of an active region below a dummy pad is not usually required, the active region Lb is provided below the dummy pads (i.e. the pad PD16, etc.) in order to make a uniform height at the upper surfaces of the plural pads PD within the main surface of the semiconductor chip, or the height at the tops of the plural bumps. The arrangement the active regions as an underlying layer for all the pads including the dummy pads allows the flatness and height at the upper surface of the underlying insulating film to be made uniform. More particularly, the state of the underlying layers for the plural pads PD can be made more uniform, thus leading to more uniform height and flatness at the upper surfaces of the plural pads PD. This results in more uniform height and flatness at the tops of the bumps bonded to the respective pads PD.

Figure 45:
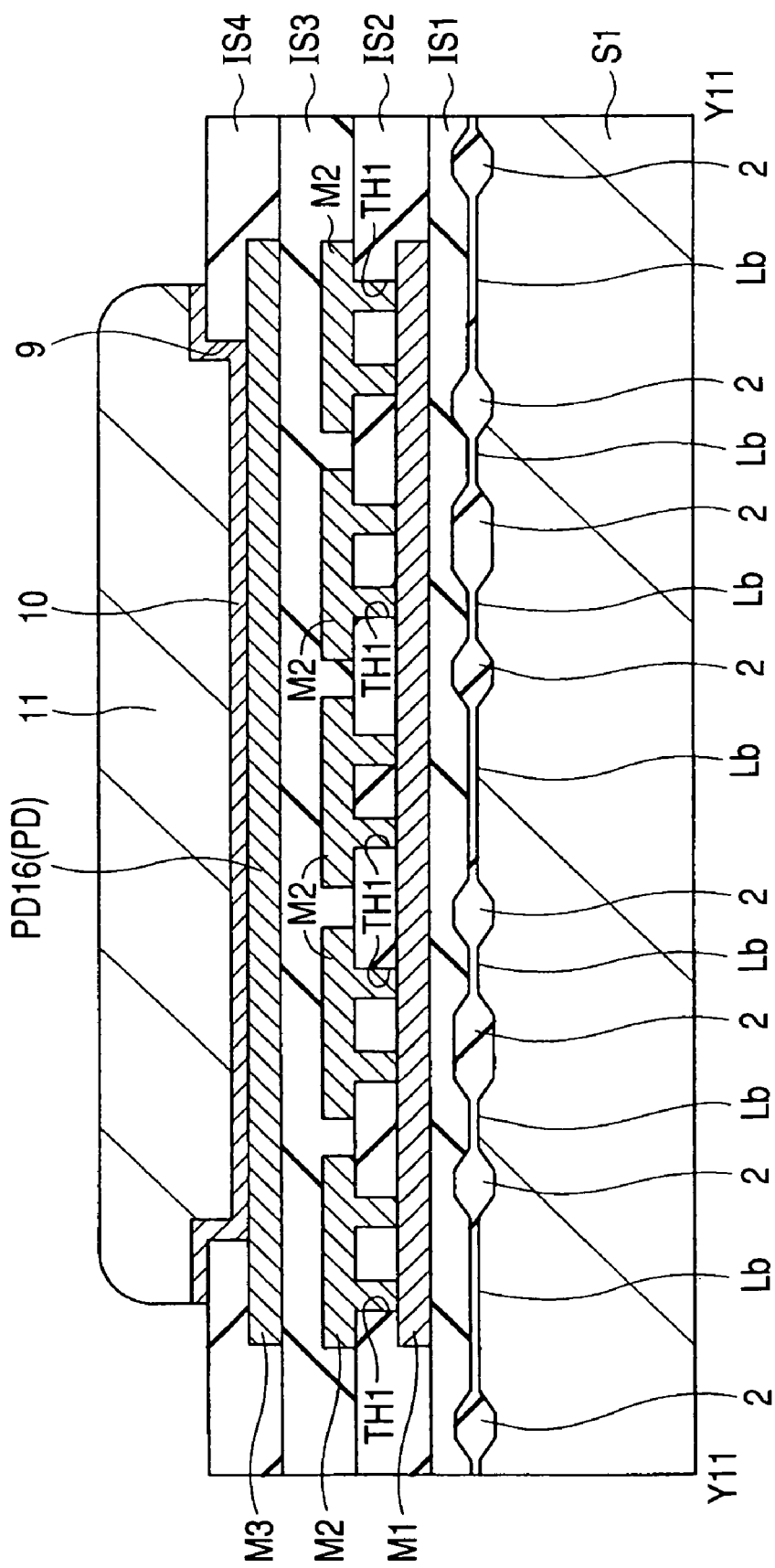
FIG. 45 is a sectional view, taken along lines Y11—Y11 of FIGS. 29, 35 and 41.

Next, the sectional structure of the semiconductor device is illustrated with reference to FIGS. 44 and 45. The substrate 1S is made, for example, of a p-type silicon (Si) single crystal. The isolation portion 2 is formed at a device-forming surface of the main surface to define the active region La and the dummy active region Lb. The isolation portion 2 is made, for example, of a silicon oxide ($SiO_2$) film formed according to a LOCOS (local oxidation of silicon) technique. It will be noted that the isolation portion 2 may be formed as an isolation portion 2 of a groove type (SGI (shallow groove isolation) or STI (shallow trench isolation)).

The active region La surrounded with the isolation portion 2 of the substrate 1S serving as an underlying layer of the pad PD14 shown in FIG. 44 is formed, for example, with a p-n junction diode D thereon. This p-n junction diode D is, for example, a protective diode for preventing electrostatic breakdown and is formed with a p-n junction between p-well PWL of the substrate 1S and an n-type semiconductor region 8 formed thereabove. The substrate 1S has an insulating film IS1, made, for example, of a silicon oxide film, formed on the main surface thereof. A first-layer wiring M1 is further formed thereon. The first-layer wiring M1 is formed, for example, by depositing, in the order from a lower layer, titanium (Ti), titanium nitride (TiN), aluminium (or an aluminium alloy), and titanium nitride (TiN). The film of aluminium or an aluminium alloy is a main material for wiring and is formed as being thickest. The lower layers of titanium and titanium nitride relative to the main wiring material layer are kinds of functional films having the barrier function of suppressing the aluminium from moving toward the substrate 1S or, on the contrary, the silicon of the substrate 1S from moving toward the wiring side, the function of improving adhesion between the insulating film IS1 and the first-layer wiring M1, and the function of suppression or preventing the breaking failure of wirings owing to the electronic migration or stress migration. The upper layer of titanium nitride relative to the main wiring material layer is a functional film which has, aside from the above-mentioned functions, a function as an antireflecting film of suppressing or preventing halation upon exposure. The first-layer wiring M1 is connected with the n-type semiconductor region 8, i.e. the p-n junction diode D1, through a plurality of contact holes CNT of a circular form in plane form in the insulating film IS1. The first-layer wiring M1 is covered with an insulating film IS2 made, for example, of a silicon oxide film. According to this embodiment, the insulating film IS2 within the plural pad regions has an upper surface formed as uniform with respect to the height thereof. The insulating film IS2 within the plural pad regions has high flatness at the upper surface thereof. This insulating film IS2 is formed thereon with a second-layer wiring M2. The material of the second-layer wiring M2 is same as that of the first-layer wiring M1. The second-layer wiring M2 is electrically connected with the first-layer wiring M1 through a plurality of through-holes TH1 of a circular form in plane formed in the insulating film IS2. The second-layer wiring M2 is covered with an insulating film IS2 made, for example, of a silicon oxide film. In this embodiment, the insulating film IS3 within the plural pad regions has an upper surface formed as uniform with respect to the height thereof. The insulating film IS3 within the plural pad regions has an upper surface whose flatness is high. The insulating film IS3 is covered thereon with a third-layer wiring M3. The third-layer wiring M3 is electrically connected with the second-layer wiring M2 through a plurality of through-holes TH2 of a circular form in plane formed in the insulating film IS3. Moreover, the third-layer wiring M3 is covered substantially with an insulating film IS4 for surface protection except that part of the third-layer wiring M3 is exposed to from an opening 9 of a rectangular form in plane formed at part of the insulating film IS4. The portion of the third-layer wiring M3 exposed from the opening 8 serves as a pad PD14 (PD). In this embodiment, the insulating films IS2, IS3 within the plural pad regions, respectively, have an upper surface formed as uniform with respect to the height thereof. Thus, the height at the upper surface of the pad PD is formed as uniform. The insulating film IS4 for surface protection is made, for example, of a single film of a silicon oxide film, a built-up film having a structure wherein a silicon nitride film is superposed on a silicon oxide film, or a built-up film having a structure wherein a silicon nitride film and a polyimide film are built-up on a silicon nitride film in this order. The pad PD14 (PD) is bonded to a bump 11 via an underlying metal film 10 through the opening 9. The underlying metal film 10 has not only the function of improving the bonding between the bump 11 and the pad PD or the insulating film IS4, but also the barrier function of suppressing or preventing the metal element of the bump 11 from moving toward the third-layer wiring M3 or, on the contrary, the metal element of the third-layer wiring M3 from moving toward the bump 11. The underlying metal film is made, for example, of a single film of a high melting metal such as titanium (Ti), titanium tungsten (TW) or the like, or a built-up film having a structure wherein a nickel (Ni) film and a gold (Au) film are built-up on a titanium film in this order. The planar size of the underlying metal film 10 is slightly larger than the opening 9 of the pad PD 14 (PD) and is substantially the same as that of the bump 11, and is, for example, at about 40 μm×70 μm. The bump 11 is made, for example, of gold (Au) and is formed, for example, by plating. For the material of the bump 11, a lead (Pb)-tin (Sn) solder may also be used, for example.

On the other hand, such an active region Lb as set out hereinabove is formed in the underlying substrate 1S of the dummy pad PD16 shown in FIG. 45. This active region Lb has no element formed therein. As a matter of course, a diode or other element may be formed, or a p-well or an n-well may be formed, like other pads. The second-layer M2 and the first-layer wiring M1, which are, respectively, an underlying layer of the dummy pad PF16, are electrically connected to each other through a plurality of through-holes TH11. Since the pad PD16 is a dummy pad, it is not necessary to electrically connect the underlying layers of the second-layer wiring M2 and the first-layer wiring M1. Especially, with the first-layer wiring M1, a plurality of through-holes TH1 are provided in the underlying layer of the pad PD16 so as to provide the same structure as with the underlying layers of other pads PD. This enables the upper surface of the dummy pad PF16 to have a height further close to the height at the upper surfaces of other pads PD. More particularly, the height at the top of the bump 11 bonded to the dummy pad PD16 can be made more closely to the height at the tops of the bumps 11 bonded to other pads PD.

Next, an example of a manufacturing procedure of the semiconductor device illustrated hereinabove is described. The isolation portion 2 is formed in the main surface of the substrate 1S constituting a wafer which is substantially circular in plane, for example, by a LOCOS technique, thereby forming the active regions La, Lb. Thereafter, an element is formed in the active region La surrounded by the isolation portion 2. No element is formed in the active region Lb below the dummy pad PD16. Subsequently, the insulating film IS1 is deposited over the main surface of the substrate 1S by a CVD (chemical vapor deposition) method, followed by forming contact holes CNT of a circular form in plane at given portions of the insulating film IS1 according to photolithographic and dry etching techniques. Thereafter, a titanium nitride film, a titanium film, an aluminium film and a titanium nitride film are, for example, deposited on the insulating film IS1 in this order by a sputtering method or the like. The thus deposited metal film is subjected to patterning by photolithographic and dry etching techniques to form the first-layer wiring M1. Next, the insulating film IS2 is deposited on the insulating film IS1 in a similar way, and the through-holes TH1 are formed in the insulating film IS2, followed by forming the second-layer wiring M2 on the insulating film IS2, like the first-layer insulating M1. The insulating film IS3 is likewise deposited over the insulating film IS2 and the through-holes TH2 are formed in the insulating film IS3, followed by forming the third-layer wiring M3 on the insulating film IS3, like the first-layer wiring M1. In order that the occupation rates of the respective wirings are made uniform as stated hereinbefore, these wiring layers are appropriately provided with the slits SL (not shown). For instance, after formation of the first-wiring layer M1, grooves are formed in the first wiring layer M1 by patterning with photolithographic and dry etching techniques. Thereafter, the insulating film IS2 is buried in the grooves by the step of depositing the insulting film IS2 to form the slits SL. In case where the slit SL is, respectively, formed in other wiring layers including the second wiring layer M2 and the third wiring layer M3, a similar procedure can be used. Thereafter, after deposition of the insulating film IS4 for surface protection on the insulating film IS3, the opening 9 is formed in the insulating film IS4 so that part of the third-layer wiring is exposed, thereby forming the pad PD. Next, a single film of a high melting metal film such as, for example, titanium, titanium tungsten or the like, or a conductive film of a built-up film having structure wherein a nickel film and a gold film are built up on a titanium film in this order is deposited by a sputtering method or the like, followed by forming a photoresist pattern in such a way as to expose a bump-forming region and cover the other regions therewith. The bump 11 made, for example, of gold is formed by plating or the like, followed by removing the photoresist pattern and further the underlying conductive film by etching, thereby forming the underlying metal film 10. In this manner, a semiconductor device having the bumps 11 on the respective pads is fabricated. In the course of such fabrication of the semiconductor device, the upper surfaces of the insulating films IS1 to IS3 are flattened according to an etch back method for a chemical mechanical polishing (CMP) method, thereby permitting the upper surface levels of a plurality of pads Pd within the main surface of the semiconductor chip 1C, i.e. the top levels of the bumps, to be made more uniform. Additionally, the flatness at the upper surfaces of the respective pads PD can be improved. In case where the etch back method is adopted, for example, the insulating film IS1 is deposited and its upper surface is etched back. Thereafter, the insulating film IS2 is deposited thereon, with its upper surface being further etched back. In this way, it is preferred that etching back is performed on each of the insulating films IS1 to IS3 by an anisotropic dry etching technique. On the other hand, where the CMP method is adopted, good results are obtained by performing CMP only on the upper surface of the underlying insulating film IS3 alone where the pad PD is formed, although each of the insulating films IS1 to IS3 may be subjected to CMP. More particularly, the uniformity of the height or level at the top of the bumps 11 can be enhanced by subjecting the respective insulating films IS1 to IS3 to etching-back or CMP, or by subjecting the insulating film IS3 alone to CMP at the upper surface thereof.

Figure 47:
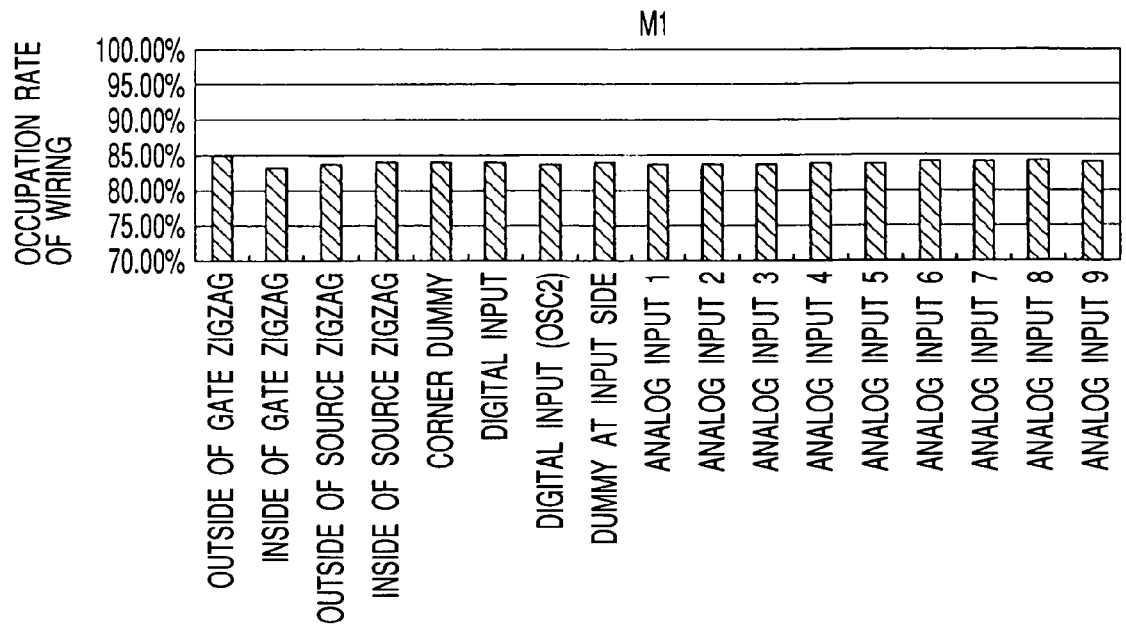
FIG. 47 is a histogram showing the occupation rate of the first-layer wiring of FIG. 46.
Figure 48:
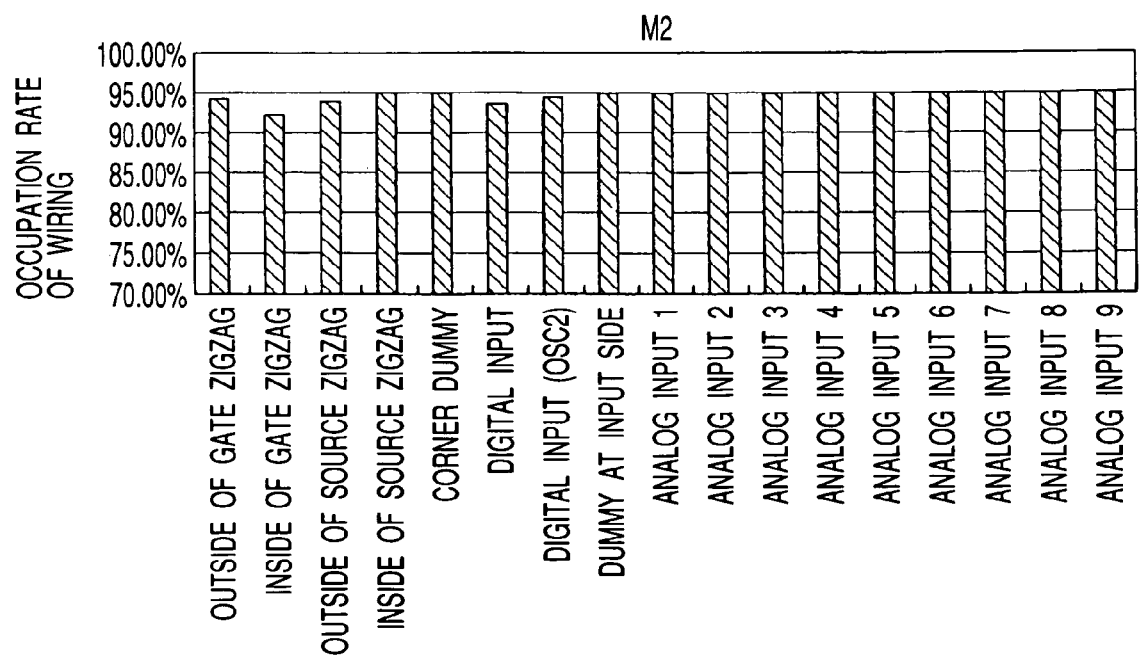
FIG. 48 is a histogram showing the occupation rate of the second-layer wiring of FIG. 46.

Next, FIG. 46 shows occupation rates of individual wiring layers below the pads PD of the semiconductor device of this embodiment shown in FIG. 25. FIG. 47 is a bar graph showing the occupation rates of the first-layer wiring of FIG. 46. FIG. 48 is a bar graph showing the occupation rates of the second-layer wiring of FIG. 46. The occupation rates of the wirings below the pads PD for the respective wiring layers are so controlled as to be substantially equal to one another. The variation (4σ) of the height at the tops of the bumps 11 within a main surface of the semiconductor chip prior to an improvement made by the invention or in prior art, is, for example, at about 1.5 μm on lot average. In contrast, according to this embodiment, the variation (4σ) of the height at the tops of the bumps 11 within a main surface of the semiconductor chip is, for example, at about 0.85 μm on lot average, so that we could meet our requirement of 4σ<1.0 μm. The peak-to-valley difference (i.e. a difference between the highest and the lowest levels) of the pads PD within the main surface of the semiconductor chip 1C has been found to be, for example, at 0.3 μm. Likewise, the peak-to-valley difference of the bumps within the main surface of the semiconductor chip 1C has been found to be, for example, at 3.0 μm. According to our studies, it is preferred that the variation of the area occupation rate of wirings below the pads PD is within 10%, more preferably within 5%. In this time, variation in the occupation rate of wirings below the pads PD is about 3%. It is also preferred that the area occupation rate of wirings below the pads PD is 50% or over. When the above-stated CMP treatment is carried out, the variation (4σ) of the height at the tops of the bumps within the main surface of the semiconductor chip 1C is, for example, at 0.78 μm on lot average, and the peak-to-valley difference of the bumps 11 is, for example, at 2.3 μm. It will be noted that the value of 4σ means a value showing a variation of the bump height or level which is obtained by calculating through statistic processing of bump heights at several to several tens of portions (e.g. 60 portions) within the main surface of the semiconductor chip. The bump height used herein means a distance from a given reference position to the top of the bump 11. The given reference position used herein is determined as an upper surface of the insulating film IS4 for surface protection, and may be determined at the main surface of the substrate IS.

Figure 49:
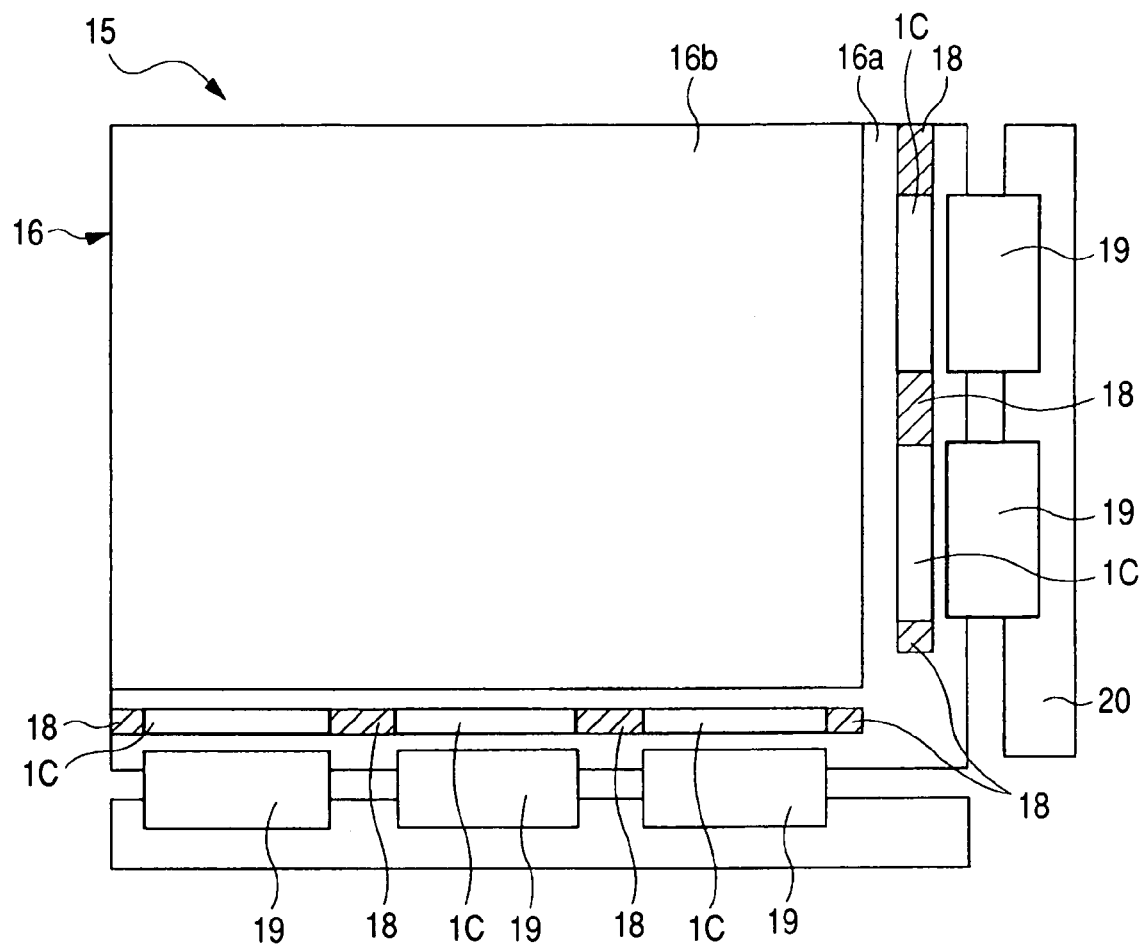
FIG. 49 is a plan view of an essential part of a liquid crystal display.
Figure 50:
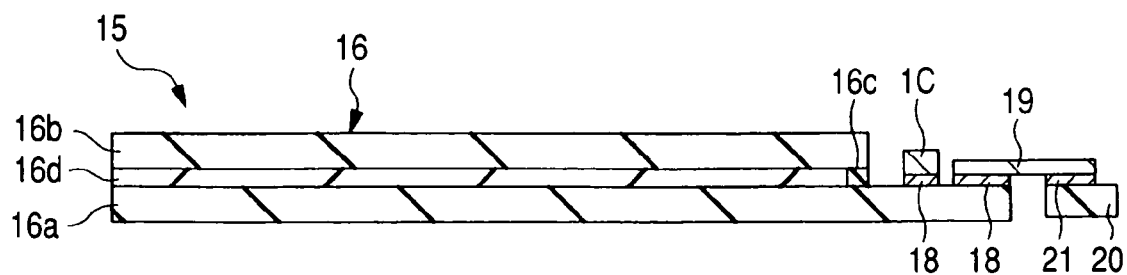
FIG. 50 is a sectional view of the essential part of FIG. 49.
Figure 51:
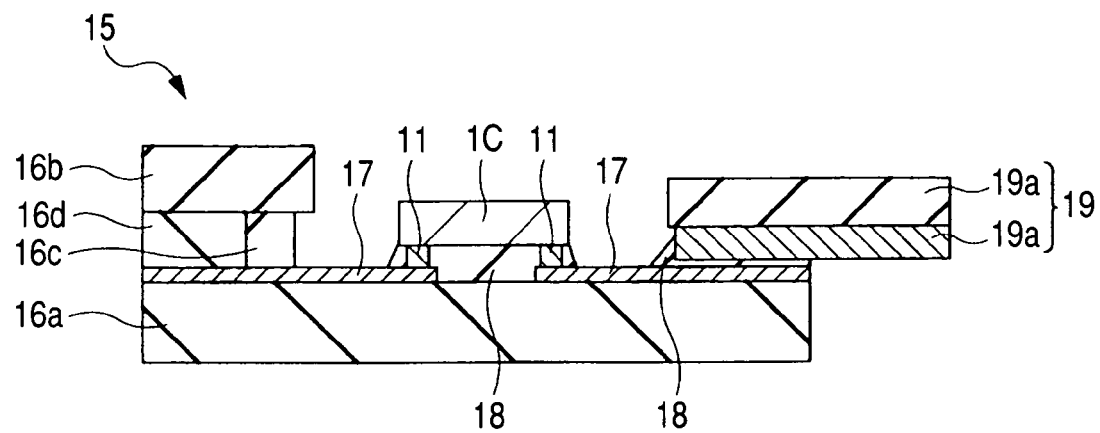
FIG. 51 is an enlarged, sectional view of the essential part of FIG. 50.
Figure 52:
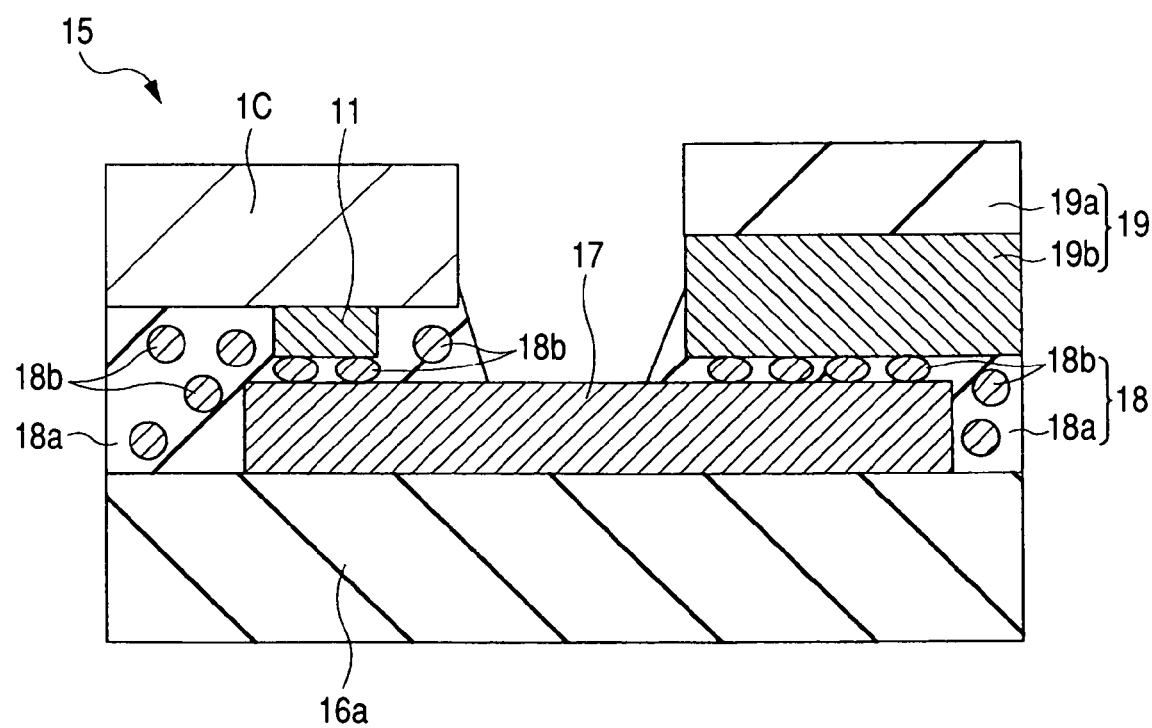
FIG. 52 is an enlarged, sectional view of the essential part of FIG. 51.

Next, an instance of LCD assembling the semiconductor device of the embodiment is described. FIG. 49 is a plan view of an essential part of LCD 14, FIG. 50 is a sectional view of the essential part of FIG. 49, FIG. 51 is an enlarged, sectional view of the essential Part of FIG. 50, and FIG. 52 is an enlarged, sectional view of FIG. 51. LCD 15 has a liquid crystal panel, a semiconductor chip 1C for LCD drive, and a back light. The liquid crystal panel 16 has two glass substrates 16a, 16b of a rectangular form in plane, a seal member 16c provided between the two glass substrates 16a, 16b at the peripheral portions thereof, a liquid crystal material 16d sealed between the two glass substrates 16a, 16b, and a polarizer plate attached at the back side of the front surface of the liquid crystal panel 16. LCD 15 includes an active type using a thin film transistor (TFT) and a passive type using a simple matrix liquid crystal (super twisted nematic). With the active type, an array of pixels which indicate a minimum unit for displaying a letter or picture on a screen, and wirings 17, such as a gate wiring and a source wiring, for driving the pixels are formed. In this case, each of a plurality of pixels has TFT and a capacitor. With the active type, a color filter is formed at the glass substrate 16b. In this case, alkali-free glass is used, for example, as a material of the glass substrates 16a, 16b. On the other hand, with passive type, the glass substrates 16a, 16b are, respectively, formed thereon with wirings 17 extending along mutually intersecting directions. A phase difference plate is provides, aside from the polarizer plate. In this case, soda lime or low alkali glass is used, for example, as a material for the glass substrates 16a, 16b. With either the active type or the passive type, a transparent conductive film (ITO: indium tin oxide film) made of indium and tin oxides is used, for example, as the wiring 17. In either case, the semiconductor chip 1C is connected to the glass substrate 16a, for example, through an anisotropic conductive film (ACF) 18 in such a state that the surface (i.e. the surface on which the wirings 17 are formed) on which the bumps 11 are formed is directed toward the main surface of the glass substrate 16a (i.e. COG: chip on glass). The anisotropic conductive film 18 is made of an electric connection material, which is made, for example, by dispersing or orienting conductive particles 18b, such as carbon black, nickel fine particles or ball solder, in an insulating bonding agent made of a thermosetting resin such as an epoxy resin. The bumps 11 of the semiconductor chip 1C and the wirings 17 of the glass substrate 16a are electrically connected with one another by means of the conductive particles 18b interposed therebetween in a crushed condition. An anisotropic conductive paste (ACP) may be used in place of the ACF. The wirings at the outer periphery of the glass substrate 16a is electrically connected with a printed board 20 through a flexible substrate 19. The flexible substrate 19 includes a substrate body 19a made, for example, of a polyimide resin or the like and a wiring 19b bonded to the surface of the body and mainly composed of copper (Cu). The wiring 19b of the flexible substrate 19 is electrically connected to the wiring 17 of the glass substrate 16a at one end thereof through the anisotropic conductive film 18 in the same manner as with the semiconductor chip 1C. On the other hand, the other end of the wiring 19b is electrically connected to the wiring of the printed board 20 by means of a solder 21 or the like. The printed board 20 mounts thereon a semiconductor chip for control circuit for controlling the operation of a LCD driver circuit of the semiconductor chip 1C, or the like electronic parts.

The semiconductor chip 1C is packaged on the glass substrate 16a in the following way. Initially, the anisotropic conductive film 18 is attached to the glass substrate 16a, after which the bump 11-forming surface of the semiconductor chip 1C is placed in face-to-face relation with the glass substrate 16a and the bumps 11 are placed in registration with corresponding wirings 17. Subsequently, the bump 11 of the semiconductor chip 1C is pressed against the wiring 17 through the anisotropic conductive film 18 at a given compression pressure, followed by keeping heating conditions for several tens of seconds to integrally connect a plurality of bumps 11 and a plurality of wirings 17 under compressed conditions. In the course of the heating and compressing steps, a bonding agent is melted and caused to flow, so that the space between the semiconductor chip 1C and the glass substrate 16a is filled therewith thereby sealing the semiconductor chip 1C. The conductive particles 18b in the anisotropic conductive film 18 are captured between the bump 11 and the wiring 17, and the bump 11 and the wiring 17 are electrically connected through the thus captured conductive particles. In place of the connection using such ACF (or ACP), a connection procedure using NCP (non-conductive paste) may be adopted. The NCP connection is one using an insulating paste (insulating bonding agent) wherein a conductive particle-free connection structure of the ACP connection is provided. With the NCP connection, the packaging procedure per se of the semiconductor chip 1C is performed in the same way as with the case using the ACF or ACP. In NCP, the bumps 11 and the wirings 17 are, respectively, connected through direct pressure contact or compression without connection through conductive particles as in ACP thereby fixing with an insulating bonding agent under pressure contact conditions. In the ACF, ACP or NCP, the variation in height and the surface flatness of the bumps 11 are an important factor for obtaining stability of bonding between the bumps 1 and the wirings 17 because the compression force and heating temperature at the time of packaging are lower than those of a system where the melting of the bumps 11 are utilized. Accordingly, the use of the embodiment of this invention wherein the heights of the bumps 11 within the main surface of the semiconductor chip 1C can be made uniform and high surface flatness of the bumps 11 can be obtained is effective in ensuring good connection between the plural bumps 11 and the plural wirings 17 within the main surface of the semiconductor chip 1C. Especially, in NCP, since any conductive particles do not intervene between the bumps 11 and the wirings 17, the variation in height and the flatness of the bumps 11 act greatly on the stability of bonding between the bumps 11 and the wirings 17, so that the use of this embodiment is more effective in good connection between the plural bumps 11 and the plural wirings 17. Accordingly, according to the embodiment, the percent assembling defective upon packaging the semiconductor chip 1C in LCD 15 can be reduced.

Embodiment 2

In this embodiment, the case of application, for example, to TCP (tape carrier package) is described. FIG. 54 is an enlarged, sectional view of an essential part at an inner lead side of TCP of FIG. 53.

TCP has a base tape (packaging or mounting body) 25, a plurality of leads formed on the surface thereof, a semiconductor chip 1C connected to the tips of inner leads 26a of the leads 26 through the bumps 11, a sealing portion 27 for sealing the semiconductor chip 1C, the inner leads 26a and the like, a solder resist 28 covering part of the leads 26 on the surface of the base tape 25. The base tape 25 is made, for example, of a polyimide resin or the like. The leads 26 are each made, for example, of al alloy of copper (Cu) and tin (Sn), with its surface being plated with a solder (Pb—Sn) or gold (Au). The inner leads 26a of the leads 26 covered with the sealing portion 27 and outer leads 26b exposed from the sealing portion 27 are integrally formed. The sealing portion 27 is made, for example of an epoxy resin.

For packaging the semiconductor chip 1C on the base tape 25, the following procedure is carried out. Initially, the main surface (i.e. the surface on which a plurality of bumps 11 are formed) of the semiconductor chip 1C is faced up and placed on a bonding stage, after which the bumps within the main surface of the semiconductor chip 1C and the inner leads of the base tape 25 are registered, respectively. Subsequently, the plural inner leads 26a are pressed against the plural bumps 11 by means of a bonding tool heated to a given temperature, thereby permitting the plural inner leads 26a and the plural bumps 11 are bonded under compression in block. If a solder is plated on the surface of the inner leads 26a, the inner leads 26a and the bumps 11 are bonded through a gold-tin eutectic alloy. If the inner leads 26a are plated with gold on the surface thereof, the inner leads 26a and the bumps 11 are bonded through gold—gold bonding.

Figure 53:
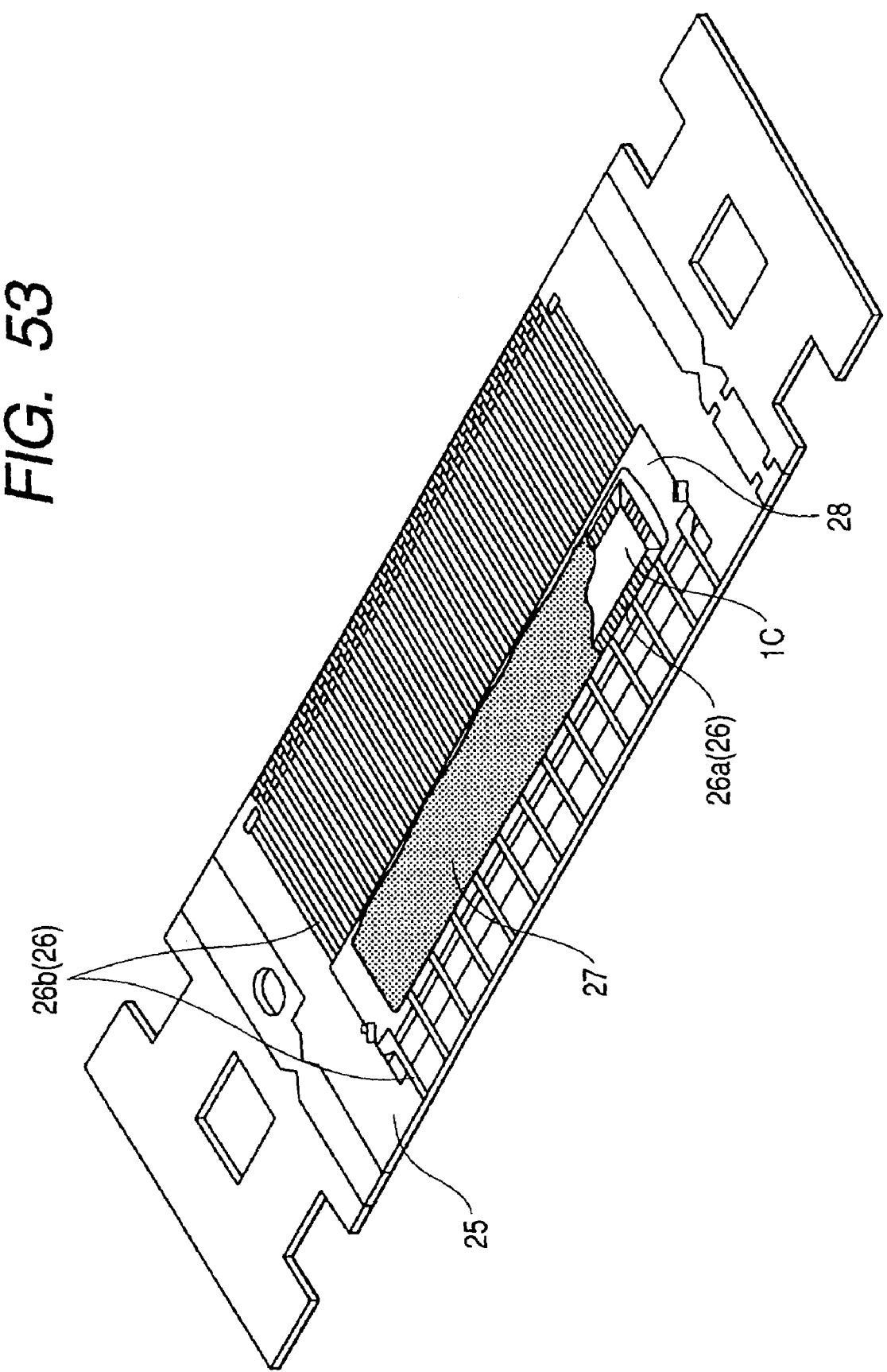
FIG. 53 is a perspective view of an essential part of TCP according to another embodiment of the invention.
Figure 54:
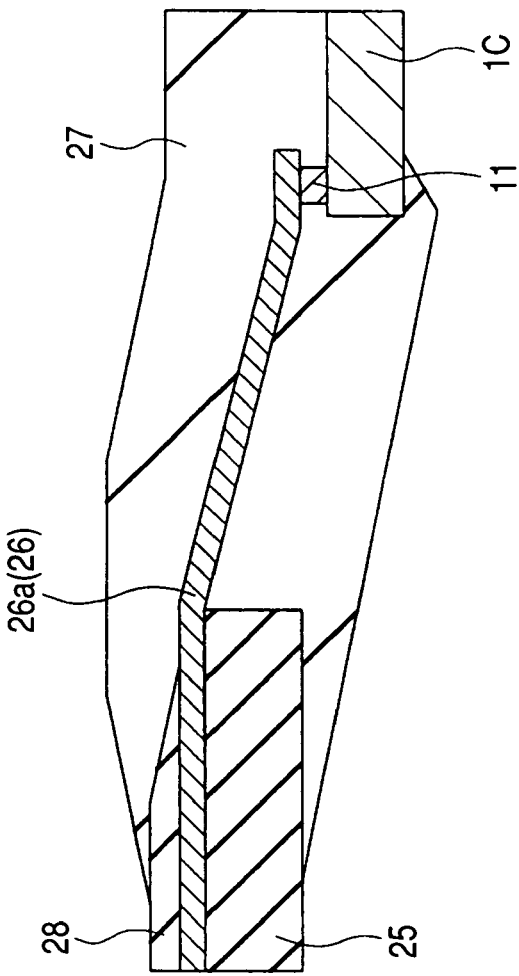
FIG. 54 is an enlarged, sectional view of the essential part at the inner lead side of TCP of FIG. 53.
Figure 55:
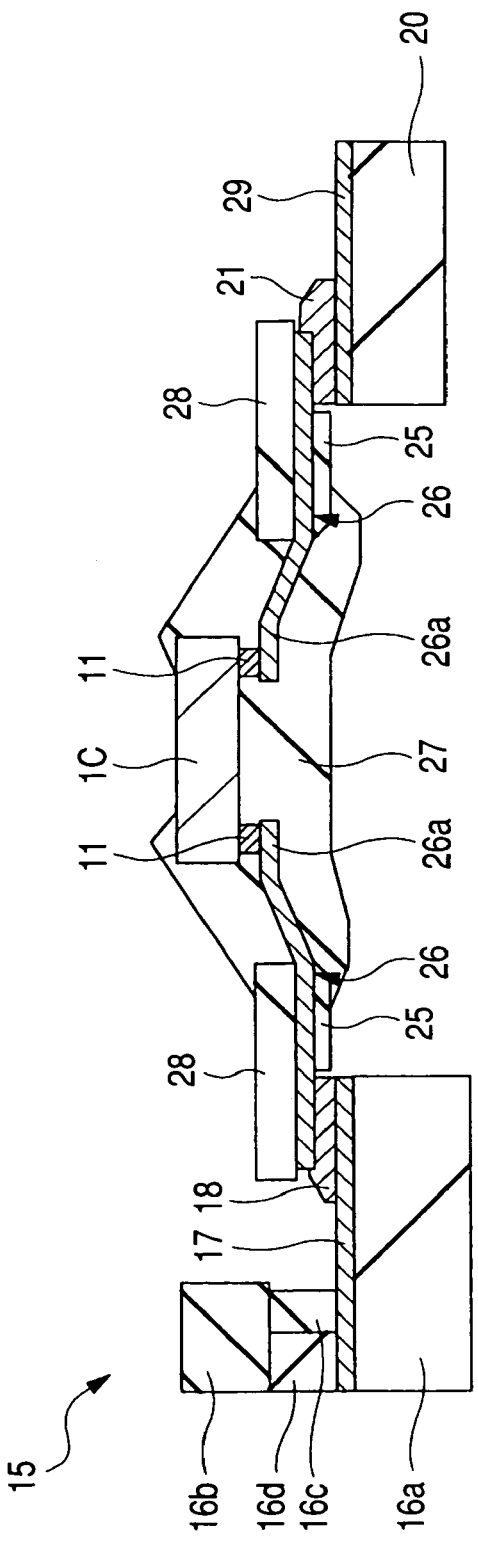
FIG. 55 is a sectional view of an essential part in a packaging state of TCP of FIG. 53 in a liquid crystal display.

Next, FIG. 55 is a sectional view of an essential part of TCP of FIG. 53 packaged with LCD 15. One of long-side leads 26 (outer lead 26b) of TCP is electrically connected to the wiring 17 of the LCD 15 through the anisotropic conductive film 18 in the same manner as set out above. The other long-side lead 26 of TCP (outer lead 26b) is electrically connected to the wiring 29 of the printed board 20 by means of a solder 21. The anisotropic conductive film 18 may be used in place of the solder 21.

In this embodiment, the plural bumps within the main surface of the semiconductor chip 1C become uniform with respect to the height thereof. Because the bumps 11 have high surface flatness, so that good connection between the plural bumps 11 of the semiconductor chip 1C and the plural inner leads 26a of TCP is ensured. Thus, according to this embodiment, an assembling defective percent can be reduced when the semiconductor chip 1C is packaged on a tape carrier.

Embodiment 3

In this embodiment, application, for example, to COF (chip on film) is described.

Figure 56:
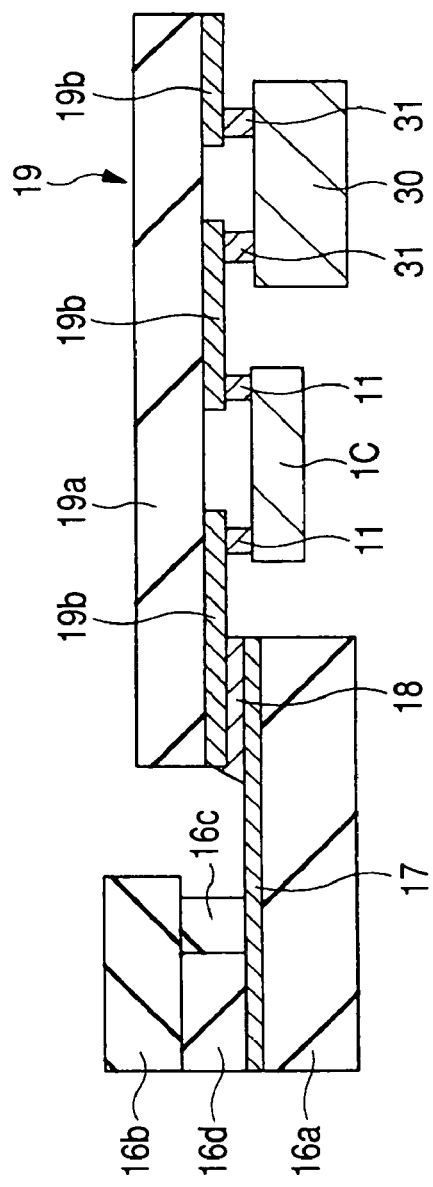
FIG. 56 is a sectional view of an essential part in a packaging state of a semiconductor device, embodying the invention, on a liquid crystal display with COF.

FIG. 56 is a sectional view of an essential part of a semiconductor device of this embodiment packaged on LCD 15 by COF. A plurality of wirings 19b of a flexible substrate (packaging body) 19 are electrically connected with wirings 17 of LCD 15 through the anisotropic conductive film in the same manner as set forth hereinbefore. The wirings 19b of the flexible substrate 19 are electrically connected to the semiconductor chip 1C through the bumps 11. Moreover, the wirings 19b are also electrically connected with other type of electronic part 30 through a solder bump 31. The electronic part 30 has a control circuit or the like for controlling the operation of the semiconductor chip 1C. The method of packaging the semiconductor chip 1C on a flexible substrate 19 is carried out in the same manner as in the foregoing Embodiment 1.

In this embodiment, the plural bumps 11 within the main surface of the semiconductor chip 1C is made uniform with respect to the height thereof. The respective bumps 11 have high surface flatness, so that good connection between the plural bumps 11 of the semiconductor chip 1C and the plural wirings 19b of the flexible substrate 19 is ensured. Thus, according to this embodiment, when the semiconductor chip 1C is packaged on the flexible substrate 19, the assembling defective percent can be reduced.

Embodiment 4

Figure 57:
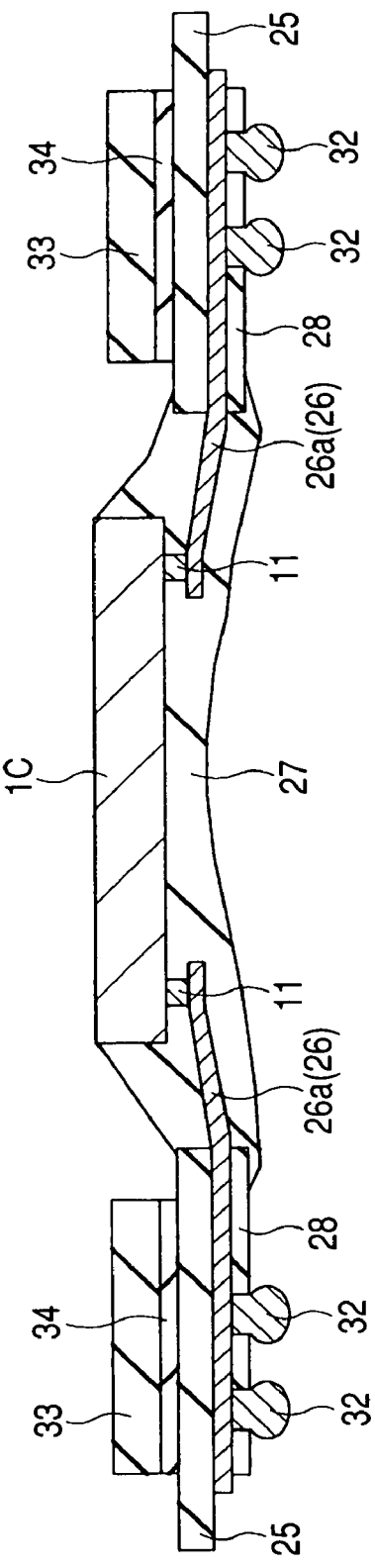
FIG. 57 is a sectional view of T-TF/BGA (CSP) of a fan-out type according to a further embodiment of the invention.

In this embodiment, application, for example, to BGA (ball grid array) is illustrated. FIG. 57 is a sectional view of a T-TF (tape-type thin fine-pitch)/BGA (CSP: chip size package), for example, of a fan-out type. A lead 26 on a base tape 25 is electrically connected to a semiconductor chip 1C through a bump 11. In this case, the semiconductor chip 1C is formed thereon, in place of the afore-mentioned LCD driver circuit, with a multipin circuit including a logic circuit such as, for example, a microprocessor or the like, or ASIC (application specific IC) such as a cell base IC or a gate array. All or part of pads PD is arranged in an active region in the same manner as in the foregoing Embodiment 1. The lead 26 is electrically connected to solder balls 32 at an outer peripheral side of the semiconductor chip 1C. This solder ball is connected to a solder resist 28 on the base tape 25 through an opening. In order to ensure the flatness of the solder balls, the base tape 25 is attached with stiffeners 33 by means of an adhesive 34 at the back side thereof. The stiffener 33 is made mainly of copper, for example, and a material for the stiffener is so selected that a difference in coefficient of thermal expansion relative to a packaging substrate becomes small, which in turn reflects on a small stress on the solder balls after packaging on the packaging substrate. The stress caused by the difference in thermal expansion between the semiconductor chip 1C and the packaging substrate is alleviated by means of the base tape 25. Accordingly, an underfill after packaging is unnecessary.

In this embodiment, the plural bumps 11 within the main surface of the semiconductor chip 1C become uniform with respect to the height thereof. The surface flatness of the respective bumps 11 is high, so that good connection between the plural bumps of the semiconductor chip 1C and the plural leads 26 of the base tape 25 is ensured. Thus, according to this embodiment, the assembling defective percent can be reduced.

Embodiment 5

Figure 58:
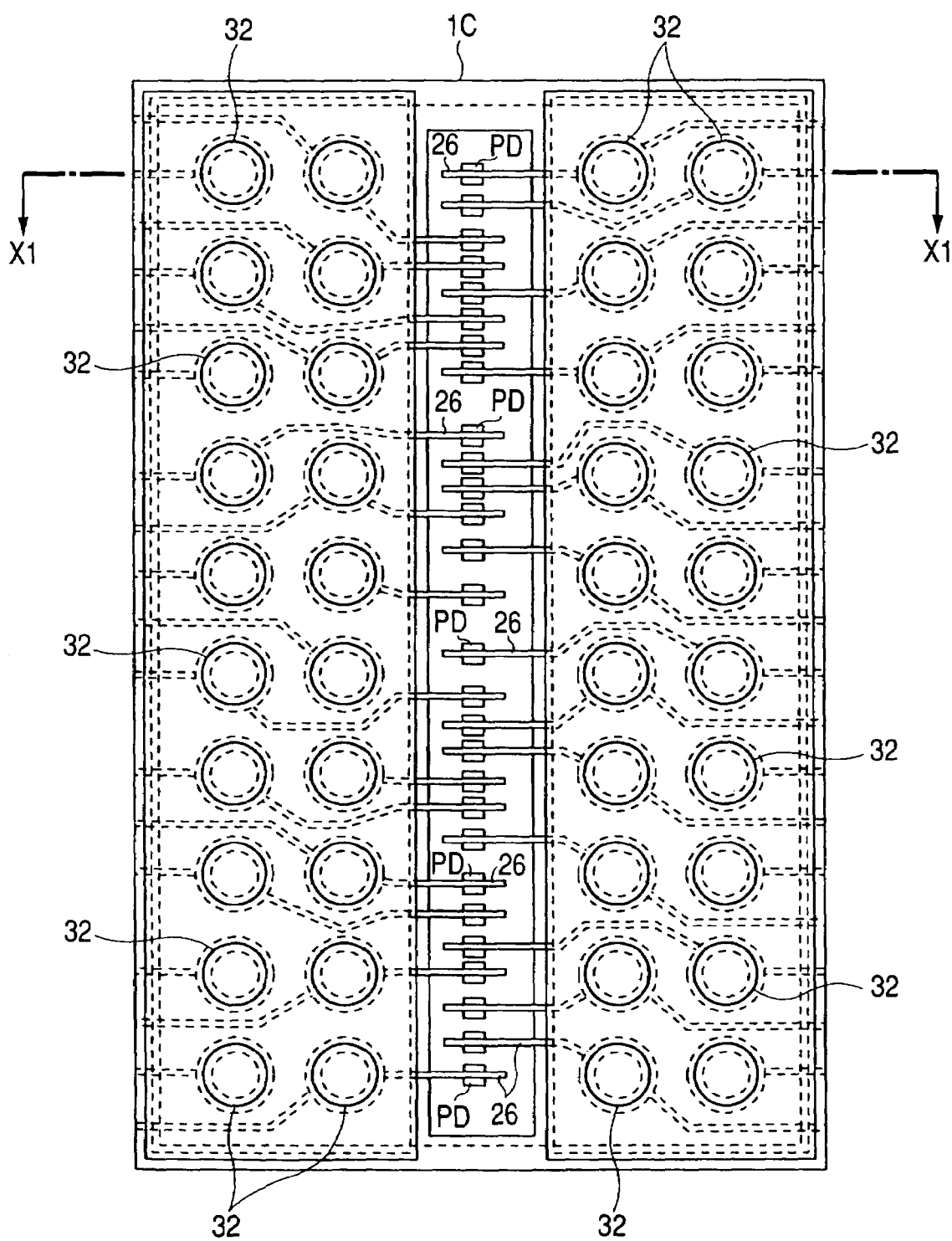
FIG. 58 is a plan view of T-TF/BGA (CSP) of a fan-in type according to a still further embodiment of the invention.
Figure 59:
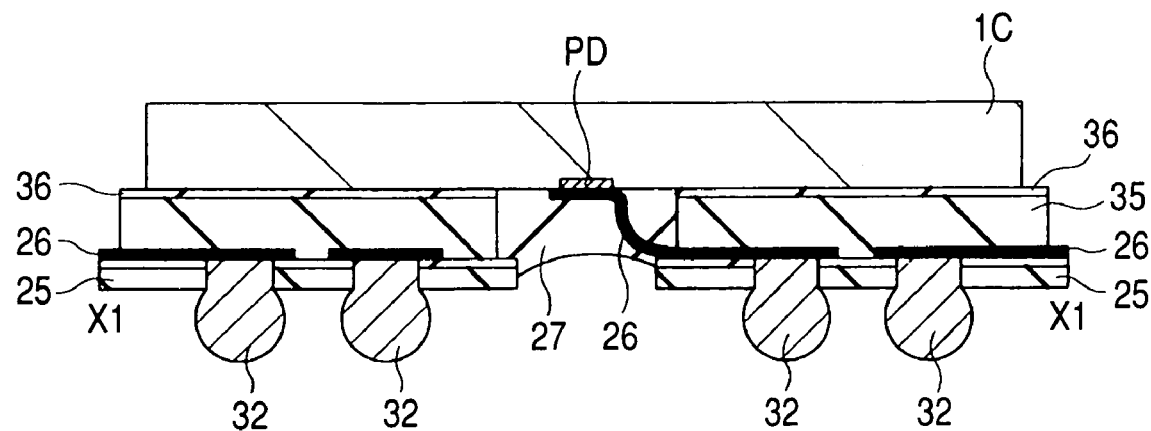
FIG. 59 is a sectional view, taken along line X1—X1 of FIG. 58.
Figure 60:
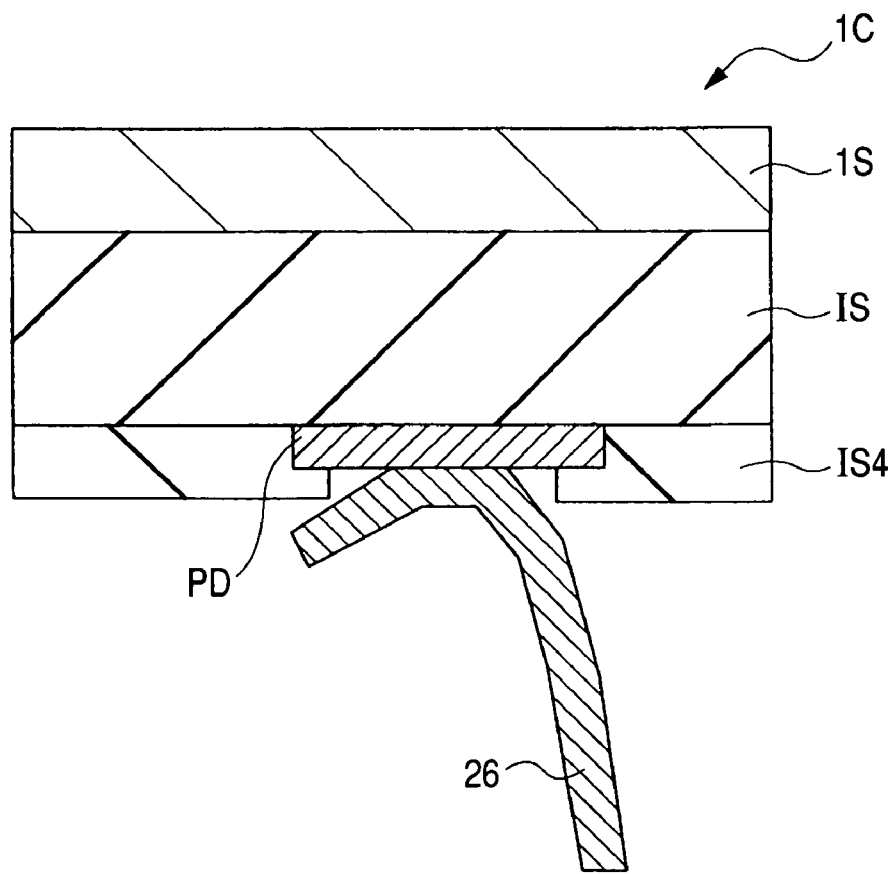
FIG. 60 is an enlarged, sectional view of an essential part of FIGS. 58 and 59.

In this embodiment, another application, for example, to BGA (ball grid array) is illustrated. FIG. 58 is a plan view of a T-TF/BGA (CSP), for example, of a Fan-In type, FIG. 59 is a sectional view, taken along line X1—X1 of FIG. 58, and FIG. 60 is an, enlarged sectional view of an essential part of FIGS. 58 and 59. It will be noted that in FIG. 60, IS indicates an insulating film.

In this embodiment, a memory circuit such as DRAM (dynamic random access memory) or the like is formed in the main surface of the semiconductor chip 1C in place of the afore-mentioned LCD driver circuit. Pads PD are arranged along vertical direction of FIG. 58 at the center of the semiconductor chip 1C (i.e. a so-called center pad system), and elements and wirings constituting the peripheral circuits of DRAM are disposed within the active region. An elastomer (i.e. a resin having elasticity) 35 is bonded on the main surface (except for pad-forming region) of the semiconductor chip 1C by means of an adhesive 36. The base tape 25 is bonded to the elastomer 35. The solder balls 32 are electrically connected to the leads through throughholes formed in the base tape 25, respectively. This solder ball 32 has such a structure as to be provided only below the main surface of the semiconductor chip 1C. Such intervention of the elastomer between the main surface of the semiconductor chip 1C and the base tape 25 enables one to suppress thermal stress at the foot of the solder ball 32 in case where an inexpensive glass-epoxy substrate is sued as a packaging substrate. The lead 26 is connected with the pad PD in a condition deflected substantially in S or sigmoidal form. This permits the stress concentrated at the connection between the lead 26 and the pad PD to be mitigated. The tip of the lead 26 is plated, for example, with gold (Au). The tip of the lead 26 is directly bonded with the pad PD without a bump. The lead 26 and the pad PD are sealed with a sealing portion 27. In this case, any underfill is not necessary after packaging.

In this embodiment, the plural pads PD within the main surface of the semiconductor chip 1C are uniform with respect to the height thereof. Because he respective pads PD have high surface flatness, good connection between the plural pads PD of the semiconductor chip 1C and the plural leads 26 of the base tape 25 is ensured. Thus, according to this embodiment, the assembling defective percent of the semiconductor device can be reduced.

The invention has been particularly described based on the embodiments made by us, and should not be construed as limiting these embodiments. Many changes and modifications may be possible without departing from the spirit of the invention.

For instance, although the occupation rates of wirings within pad regions for all the wiring layers below the pads of the semiconductor device are made substantially equal to one another in the foregoing embodiments, the occupation rates of wirings within pad regions for part of wiring layers may be made equal to one another.

In the foregoing embodiments, a semiconductor device having a three-layered wiring structure has been illustrated, and the invention should not be construed as limiting to such a device but may be applied to a semiconductor device having a double-layered wiring structure or a wiring layer having a three or more layers structure.

Moreover, illustration has been made in the foregoing embodiments with respect to the type of semiconductor wherein bumps are bonded to electrode pads of a semiconductor chip prior to packaging with a packaging body, to which the invention should not be construed as limiting. For instance, the invention is applicable to a system of the type wherein at the time when bumps are bonded to the wiring side (e.g. the tips of the leads of the base tape) of a packaging body without bonding to electrode pads of a semiconductor chip prior to packaging with a packaging body and the semiconductor chip is packaged with the packaging body, the electrode pads of the semiconductor chip and the wirings of the packaging body are bonded via bumps. In this case, like the foregoing embodiments, the plural electrodes at the semiconductor chip side are uniform with respect to the height thereof, so that good connection between the plural electrode pads of the semiconductor chip and the wirings of the packaging body are ensured without suffering any inconvenience.

In the foregoing, the invention made by us has been illustrated with regard to the cases where the invention is applied to LCD driver circuits, microprocessors and DRAM, which are in the field of utility as viewing from the background of the invention. The invention is not limited to these cases, but is applicable, for example, to semiconductor devices having a memory circuit such as SRAM (static random access memory), flash memory (EEPROM: electric erasable programmable read only memory) or the like, and also to semiconductor devices of a mixed loading type wherein a memory circuit and a logic circuit are provided on one substrate.

The effects obtained by typical embodiments of the invention are briefly summarized below The wiring occupation rates of the respective wiring layers below plurality of electrode pads are made uniform, so that the levels or heights at the upper surfaces of a plurality of electrode pads within a main surface of a semiconductor chip can be made substantially uniform. Moreover, the shapes, sizes or intervals of the respective wiring layers below the electrode pads are made similar to one another, the uniformity in height at the upper surfaces of the electrode pads can be enhanced.

Active regions are arranged as an underlying layer of all the electrode pads including electrode pads for dummy, so that the flatness and height at the upper surfaces underlying insulating films of all the electrode pads can be made uniform.

In other words, underlying structures for a plurality of electrode pads arranged within regions of the main surface of the semiconductor chip where elements or wirings are arranged are made uniform, under which the height of the plural electrode pads within the main surface of the semiconductor chip can be made substantially uniform.

Because bonding failure can be reduced between the electrode pads of the semiconductor chip and the wiring of a packaging body for packaging the semiconductor chip, an assembling defective percent can be reduced when the semiconductor chip 1C is packaged.

The greatest effect obtained by the invention is as follows.
Heights of plural electrode pads within a main surface of a semiconductor chip can be made uniform.

What is claimed is:

1. A semiconductor device, comprising:
   semiconductor elements formed on a substrate;
   plural electrode pads arranged over said semiconductor elements; and
   a wiring layer arranged over said semiconductor elements, said wiring layer being arranged below said plural electrode pads,
   wherein in said wiring layer, area occupation rates of wirings arranged in areas of respective planar regions of the plural electrode pads are substantially uniform, and
   wherein said semiconductor elements constitute circuits for driving a liquid crystal display.

2. A semiconductor device according to claim 1, wherein the area occupation rates of wirings arranged within the areas of the planar regions of said plural electrode pads are, respectively, at least 50% of the respective areas.

3. A semiconductor device according to claim 1, wherein variations in the area occupation rates of wirings arranged within the areas of the planar regions of said plural electrode pads are, respectively, within 10%.

4. A semiconductor device according to claim 1, wherein variations in the area occupation rates of wirings arranged within the areas of the planar regions of said plural electrode pads are, respectively, within 5%.

5. A semiconductor device according to claim 1, wherein said plural electrode pads include plural dummy electrode pads and at least one of the plural dummy electrode pads has an area larger than an electrode pad for an integrated circuit associated with said plural electrode pads.

6. A semiconductor device according to claim 1, wherein a bump electrode is bonded to said plural electrode pads, respectively.

7. A semiconductor device according to claim 1, wherein a dummy wiring, which is irrelevant to said semiconductor elements and wirings and is thus in a floating condition, is arranged within the planar regions of the plural electrode pads.

8. A semiconductor device according to claim 1,
   wherein a part of a wiring layer of the wirings arranged within the planar regions of said plural electrode pads is devoid of wiring.

9. A semiconductor device comprising:
   a semiconductor element formed on a substrate;
   a wiring layer formed over said semiconductor element and having wiring connected to said semiconductor element; and
   a pad formed over said wiring layer,
   wherein in said wiring layer, an area occupation rate of wirings arranged in an area of a planar region of said pad and formed under said pad is at least 50% of said area, and
   wherein there are a plurality of said semiconductor element that constitute circuits for driving a liquid crystal display.

10. A semiconductor device according to claim 9,
    wherein said pad is a dummy pad not connected to said semiconductor element.

11. A semiconductor device according to claim 9,
    wherein a bump electrode is bonded to said pad.

12. A semiconductor device according to claim 9,
    wherein a portion of said wiring layer is devoid of wiring.

13. A semiconductor device according to claim 9,
    wherein said wiring layer includes a dummy wiring not connected to said element.

14. A semiconductor device according to claim 13,
    wherein said dummy wiring is in a floating state.

15. A semiconductor device comprising:
    a wiring layer formed over a semiconductor element on a substrate; and
    a first pad and a second pad formed over said wiring layer,
    wherein in said wiring layer, area occupation rates of wirings arranged in areas of respective planar regions of said first and second pads, and formed under said first and second pads, are at least 50% of the respective areas.

16. A semiconductor device according to claim 15,
    wherein variations in said area occupation rates are within 10%.

17. A semiconductor device according to claim 15,
    wherein variations in said area occupation rates are within 5%.

18. A semiconductor device according to claim 15,
    wherein said second pad is a dummy pad not connected to said semiconductor element.

19. A semiconductor device according to claim 18,
    wherein the planar area size of said second pad is larger than the planar area size of said first pad.

20. A semiconductor device according to claim 15,
    wherein bump electrodes are bonded to said first and second pads, respectively.

21. A semiconductor device according to claim 15,
wherein a part of said wiring layer arranged within said planar region of said first and second pads is devoid of wiring.
22. A semiconductor device according to claim 15,
wherein said wiring layer includes a dummy wiring in a floating state.
23. A semiconductor device according to claim 15,
wherein said first and second pads are arranged in zigzag form.
24. A semiconductor device comprising:
semiconductor elements formed on a substrate;
a first pad and a second pad formed over said semiconductor elements; and
a wiring layer having wiring connected to said semiconductor elements, said wiring layer being formed over said semiconductor elements and under said first and second pads,
wherein in said wiring layer, area occupation rates of wirings arranged in respective planar region areas of said first and second pads, and under said first and second pads, are at least 50% of the respective areas.
25. A semiconductor device according to claim 24,
wherein variations in said area occupation rates are within 10%.
26. A semiconductor device according to claim 24,
wherein variations in said area occupation rates are within 5%.
27. A semiconductor device according to claim 24,
wherein said second pad is a dummy pad not connected to said semiconductor elements.
28. A semiconductor device according to claim 27,
wherein the planar area size of said second pad is larger than the planar area size of said first pad.
29. A semiconductor device according to claim 24,
wherein bump electrodes are bonded to said first and second pads, respectively.
30. A semiconductor device according to claim 24,
wherein a portion of said wiring layer arranged within said planar region areas of said first and second pads is devoid of wiring.
31. A semiconductor device according to claim 24,
wherein said semiconductor elements constitute circuits for driving a liquid crystal display.
32. A semiconductor device according to claim 24,
wherein said wiring layer includes a dummy wiring not connected to said semiconductor elements.
33. A semiconductor device according to claim 32,
wherein said dummy wiring is in a floating state.
34. A semiconductor device according to claim 24,
wherein said first and second pads are arranged in zigzag form.

* * * * *